(12) United States Patent
Ahn et al.

(10) Patent No.: US 7,700,989 B2
(45) Date of Patent: Apr. 20, 2010

(54) HAFNIUM TITANIUM OXIDE FILMS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 11/565,826

(22) Filed: Dec. 1, 2006

(65) Prior Publication Data
US 2007/0090439 A1    Apr. 26, 2007

Related U.S. Application Data

(62) Division of application No. 11/140,643, filed on May 27, 2005, now Pat. No. 7,572,695.

(51) Int. Cl.
H01L 27/108    (2006.01)
(52) U.S. Cl. .............. 257/310; 438/240; 438/591; 438/785
(58) Field of Classification Search .......... 257/310, 257/E21.01; 438/785, 591, 240, 761, 763, 438/778
See application file for complete search history.

(56) References Cited

U.S. PATENT DOCUMENTS

| | | | |
|---|---|---|---|
| 3,738,817 A | 6/1973 | Benjamin | |
| 3,833,386 A | 9/1974 | Wood et al. | |
| 3,903,232 A | 9/1975 | Wood et al. | |
| 3,926,568 A | 12/1975 | Benjamin et al. | |
| 3,959,191 A | 5/1976 | Kehr et al. | |
| 4,017,322 A | 4/1977 | Kawai et al. | |
| 4,137,200 A | 1/1979 | Wood et al. | |
| 4,293,679 A | 10/1981 | Cogliano | |
| 4,302,620 A | 11/1981 | Chu | |
| 4,358,397 A | 11/1982 | Chu | |
| 4,403,083 A | 9/1983 | Marans et al. | |
| 4,940,636 A | 7/1990 | Brock et al. | |
| 4,961,004 A | 10/1990 | Bryan et al. | |
| 4,963,753 A | 10/1990 | Bryan et al. | |
| 4,963,754 A | 10/1990 | Bryan et al. | |
| 4,967,085 A | 10/1990 | Bryan et al. | |
| 4,967,087 A | 10/1990 | Bryan et al. | |
| 4,972,086 A | 11/1990 | Bryan et al. | |
| 4,972,516 A | 11/1990 | Bryan et al. | |

(Continued)

OTHER PUBLICATIONS

Aarik, Jaan, "Atomic layer growth of epitaxial $TiO_2$ thin films from $TiCl_4$ and $H_2O$ on $Al_2O_3$ substrates", *Journal of Crystal Growth*, 242(1-2), (2002), 189-198.

(Continued)

*Primary Examiner*—Matthew Smith
*Assistant Examiner*—Colleen E Rodgers
(74) *Attorney, Agent, or Firm*—Schwegman, Lundberg & Woessner, P.A.

(57) ABSTRACT

Embodiments of a dielectric layer containing a hafnium titanium oxide film structured as one or more monolayers include the dielectric layer disposed in an integrated circuit. Embodiments of methods of fabricating such a dielectric layer provide a dielectric layer for use in a variety of electronic devices.

25 Claims, 5 Drawing Sheets

U.S. PATENT DOCUMENTS

| | | |
|---|---|---|
| 4,975,014 A | 12/1990 | Rufin et al. |
| 4,975,588 A | 12/1990 | Bryan et al. |
| 4,980,559 A | 12/1990 | Bryan et al. |
| 4,980,560 A | 12/1990 | Bryan et al. |
| 4,983,847 A | 1/1991 | Bryan et al. |
| 4,988,880 A | 1/1991 | Bryan et al. |
| 4,990,282 A | 2/1991 | Bryan et al. |
| 4,992,205 A | 2/1991 | Bryan et al. |
| 4,994,205 A | 2/1991 | Bryan et al. |
| 4,996,003 A | 2/1991 | Bryan et al. |
| 5,008,034 A | 4/1991 | Bryan et al. |
| 5,017,791 A | 5/1991 | Bryan et al. |
| 5,075,536 A | 12/1991 | Towe et al. |
| 5,084,606 A | 1/1992 | Bailey et al. |
| 5,095,218 A | 3/1992 | Bryan et al. |
| 5,304,622 A | 4/1994 | Ikai et al. |
| 5,315,142 A | 5/1994 | Acovic et al. |
| 5,338,953 A | 8/1994 | Wake |
| 5,439,524 A | 8/1995 | Cain et al. |
| 5,576,567 A | 11/1996 | Mori |
| 5,703,387 A | 12/1997 | Hong |
| 5,705,415 A | 1/1998 | Orlowski et al. |
| 5,714,336 A | 2/1998 | Simons et al. |
| 5,714,766 A | 2/1998 | Chen et al. |
| 5,739,524 A | 4/1998 | Fally |
| 5,923,056 A | 7/1999 | Lee et al. |
| 5,958,140 A | 9/1999 | Arami et al. |
| 5,962,959 A | 10/1999 | Iwasaki et al. |
| 5,990,605 A | 11/1999 | Yoshikawa et al. |
| 5,998,264 A | 12/1999 | Wu |
| 5,998,528 A | 12/1999 | Tsipursky et al. |
| 6,020,024 A | 2/2000 | Maiti et al. |
| 6,020,243 A | 2/2000 | Wallace et al. |
| 6,023,124 A | 2/2000 | Chuman et al. |
| 6,023,125 A | 2/2000 | Yoshikawa et al. |
| 6,034,015 A | 3/2000 | Lin et al. |
| 6,060,755 A | 5/2000 | Ma et al. |
| 6,063,705 A | 5/2000 | Vaartstra |
| 6,066,922 A | 5/2000 | Iwasaki |
| 6,075,691 A | 6/2000 | Duenas et al. |
| 6,093,606 A | 7/2000 | Lin et al. |
| 6,103,419 A | 8/2000 | Saidi et al. |
| 6,118,147 A | 9/2000 | Liu |
| 6,124,608 A | 9/2000 | Liu et al. |
| 6,125,062 A | 9/2000 | Ahn et al. |
| 6,130,453 A | 10/2000 | Mei et al. |
| 6,130,503 A | 10/2000 | Negishi et al. |
| 6,137,025 A | 10/2000 | Ebbinghaus et al. |
| 6,141,260 A | 10/2000 | Ahn et al. |
| 6,144,155 A | 11/2000 | Yoshikawa et al. |
| 6,146,976 A | 11/2000 | Stecher et al. |
| 6,147,378 A | 11/2000 | Liu et al. |
| 6,147,443 A | 11/2000 | Yoshikawa et al. |
| 6,162,712 A | 12/2000 | Baum et al. |
| 6,166,487 A | 12/2000 | Negishi et al. |
| 6,174,809 B1 | 1/2001 | Kang et al. |
| 6,180,461 B1 | 1/2001 | Ogura |
| 6,180,980 B1 | 1/2001 | Wang |
| 6,184,612 B1 | 2/2001 | Negishi et al. |
| 6,194,237 B1 | 2/2001 | Kim et al. |
| 6,200,893 B1 | 3/2001 | Sneh |
| 6,203,613 B1 | 3/2001 | Gates et al. |
| 6,207,522 B1 | 3/2001 | Hunt et al. |
| 6,207,589 B1 | 3/2001 | Ma et al. |
| 6,217,645 B1 | 4/2001 | Vaartstra |
| 6,225,237 B1 | 5/2001 | Vaartstra |
| 6,259,198 B1 | 7/2001 | Yanagisawa et al. |
| 6,270,835 B1 | 8/2001 | Hunt et al. |
| 6,273,951 B1 | 8/2001 | Vaartstra |
| 6,274,937 B1 | 8/2001 | Ahn et al. |
| 6,278,230 B1 | 8/2001 | Yoshizawa et al. |
| 6,281,042 B1 | 8/2001 | Ahn et al. |
| 6,285,123 B1 | 9/2001 | Yamada et al. |
| 6,289,842 B1 | 9/2001 | Tompa |
| 6,291,341 B1 | 9/2001 | Sharan et al. |
| 6,297,095 B1 | 10/2001 | Muralidhar et al. |
| 6,297,103 B1 | 10/2001 | Ahn et al. |
| 6,297,539 B1 | 10/2001 | Ma et al. |
| 6,313,035 B1 | 11/2001 | Sandhu et al. |
| 6,313,518 B1 | 11/2001 | Ahn et al. |
| 6,316,298 B1 | 11/2001 | Lee |
| 6,316,873 B1 | 11/2001 | Ito et al. |
| 6,320,091 B1 | 11/2001 | Ebbinghaus et al. |
| 6,329,286 B1 | 12/2001 | Vaartstra |
| 6,346,477 B1 | 2/2002 | Kaloyeros et al. |
| 6,350,704 B1 | 2/2002 | Ahn et al. |
| 6,368,398 B2 | 4/2002 | Vaartstra |
| 6,368,518 B1 | 4/2002 | Vaartstra |
| 6,388,376 B1 | 5/2002 | Negishi et al. |
| 6,392,257 B1 | 5/2002 | Ramdani et al. |
| 6,395,650 B1 | 5/2002 | Callegari et al. |
| 6,400,070 B1 | 6/2002 | Yamada et al. |
| 6,404,124 B1 | 6/2002 | Sakemura et al. |
| 6,407,435 B1 | 6/2002 | Ma et al. |
| 6,426,292 B2 | 7/2002 | Vaartstra |
| 6,429,237 B1 | 8/2002 | Tooley |
| 6,433,383 B1 | 8/2002 | Ramsbey et al. |
| 6,433,993 B1 | 8/2002 | Hunt et al. |
| 6,445,023 B1 | 9/2002 | Vaartstra et al. |
| 6,451,641 B1 | 9/2002 | Halliyal et al. |
| 6,451,695 B2 | 9/2002 | Sneh |
| 6,454,912 B1 | 9/2002 | Ahn et al. |
| 6,455,717 B1 | 9/2002 | Vaartstra |
| 6,465,836 B2 | 10/2002 | Lin et al. |
| 6,465,853 B1 | 10/2002 | Hobbs et al. |
| 6,472,803 B1 | 10/2002 | Yoshizawa et al. |
| 6,489,648 B2 | 12/2002 | Iwasaki et al. |
| 6,492,288 B2 | 12/2002 | Shindo |
| 6,495,436 B2 | 12/2002 | Ahn et al. |
| 6,514,820 B2 | 2/2003 | Ahn et al. |
| 6,514,828 B2 | 2/2003 | Ahn et al. |
| 6,534,420 B2 | 3/2003 | Ahn et al. |
| 6,537,613 B1 | 3/2003 | Senzaki et al. |
| 6,541,280 B2 | 4/2003 | Kaushik et al. |
| 6,544,846 B2 | 4/2003 | Ahn et al. |
| 6,552,383 B2 | 4/2003 | Ahn et al. |
| 6,559,014 B1 | 5/2003 | Jeon |
| 6,562,491 B1 | 5/2003 | Jeon |
| 6,566,147 B2 | 5/2003 | Basceri et al. |
| 6,566,682 B2 | 5/2003 | Forbes |
| 6,570,248 B1 | 5/2003 | Ahn et al. |
| 6,586,792 B2 | 7/2003 | Ahn et al. |
| 6,586,797 B2 | 7/2003 | Forbes et al. |
| 6,602,053 B2 | 8/2003 | Subramaniam et al. |
| 6,608,378 B2 | 8/2003 | Ahn et al. |
| 6,613,695 B2 | 9/2003 | Pomarede et al. |
| 6,617,639 B1 | 9/2003 | Wang et al. |
| 6,620,752 B2 | 9/2003 | Messing et al. |
| 6,627,503 B2 | 9/2003 | Ma et al. |
| 6,632,279 B1 | 10/2003 | Ritala et al. |
| 6,638,859 B2 | 10/2003 | Sneh et al. |
| 6,641,887 B2 | 11/2003 | Iida et al. |
| 6,642,573 B1 | 11/2003 | Halliyal et al. |
| 6,645,882 B1 | 11/2003 | Halliyal et al. |
| 6,656,764 B1 | 12/2003 | Wang et al. |
| 6,660,660 B2 | 12/2003 | Haukka et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,682,602 B2 | 1/2004 | Vaartstra |
| 6,700,132 B2 | 3/2004 | Chuman et al. |
| 6,710,538 B1 | 3/2004 | Ahn et al. |
| 6,713,329 B1 | 3/2004 | Wagner et al. |
| 6,713,812 B1 | 3/2004 | Hoefler et al. |

| | | | | | | |
|---|---|---|---|---|---|---|
| 6,713,846 B1 | 3/2004 | Senzaki | | 6,984,592 B2 | 1/2006 | Vaartstra |
| 6,720,216 B2 | 4/2004 | Forbes | | 6,989,573 B2 | 1/2006 | Ahn et al. |
| 6,720,221 B1 | 4/2004 | Ahn et al. | | 6,995,081 B2 | 2/2006 | Vaartstra |
| 6,728,092 B2 | 4/2004 | Hunt et al. | | 7,012,297 B2 | 3/2006 | Bhattacharyya |
| 6,730,163 B2 | 5/2004 | Vaartstra | | 7,019,351 B2 | 3/2006 | Eppich et al. |
| 6,730,164 B2 | 5/2004 | Vaartstra et al. | | 7,026,694 B2 | 4/2006 | Ahn et al. |
| 6,734,480 B2 | 5/2004 | Chung et al. | | 7,030,042 B2 | 4/2006 | Vaartstra et al. |
| 6,744,063 B2 | 6/2004 | Yoshikawa et al. | | 7,037,574 B2 | 5/2006 | Paranjpe et al. |
| 6,753,567 B2 | 6/2004 | Maria et al. | | 7,041,609 B2 | 5/2006 | Vaartstra |
| 6,753,571 B2 | 6/2004 | Kim et al. | | 7,042,043 B2 | 5/2006 | Forbes et al. |
| 6,754,108 B2 | 6/2004 | Forbes | | 7,045,430 B2 | 5/2006 | Ahn et al. |
| 6,756,292 B2 | 6/2004 | Lee et al. | | 7,049,192 B2 | 5/2006 | Ahn et al. |
| 6,756,298 B2 | 6/2004 | Ahn et al. | | 7,057,244 B2 | 6/2006 | Andreoni et al. |
| 6,759,081 B2 | 7/2004 | Huganen et al. | | 7,064,058 B2 | 6/2006 | Ahn et al. |
| 6,759,151 B1 | 7/2004 | Lee | | 7,068,544 B2 | 6/2006 | Forbes et al. |
| 6,760,257 B2 | 7/2004 | Huang et al. | | 7,074,673 B2 | 7/2006 | Forbes |
| 6,767,582 B1 | 7/2004 | Elers | | 7,075,829 B2 | 7/2006 | Forbes |
| 6,767,795 B2 | 7/2004 | Ahn et al. | | 7,077,902 B2 | 7/2006 | Vaartstra |
| 6,774,050 B2 | 8/2004 | Ahn et al. | | 7,081,421 B2 | 7/2006 | Ahn et al. |
| 6,784,049 B2 | 8/2004 | Vaartstra | | 7,084,078 B2 | 8/2006 | Ahn et al. |
| 6,784,101 B1 | 8/2004 | Yu et al. | | 7,087,481 B2 | 8/2006 | Vaartstra et al. |
| 6,787,413 B2 | 9/2004 | Ahn | | 7,087,954 B2 | 8/2006 | Forbes |
| 6,787,992 B2 | 9/2004 | Chuman et al. | | 7,101,813 B2 | 9/2006 | Ahn et al. |
| 6,790,791 B2 | 9/2004 | Ahn et al. | | 7,109,079 B2 * | 9/2006 | Schaeffer et al. ............ 438/199 |
| 6,794,250 B2 | 9/2004 | Chang et al. | | 7,112,485 B2 | 9/2006 | Vaartstra |
| 6,794,284 B2 | 9/2004 | Vaartstra | | 7,112,841 B2 | 9/2006 | Eldridge et al. |
| 6,794,709 B2 | 9/2004 | Ahn et al. | | 7,115,166 B2 | 10/2006 | Vaartstra et al. |
| 6,797,561 B2 | 9/2004 | Ko et al. | | 7,115,528 B2 | 10/2006 | Vaartstra et al. |
| 6,800,895 B2 | 10/2004 | Chang et al. | | 7,122,415 B2 | 10/2006 | Jang et al. |
| 6,803,326 B2 | 10/2004 | Ahn et al. | | 7,122,464 B2 | 10/2006 | Vaartstra |
| 6,812,100 B2 | 11/2004 | Ahn et al. | | 7,125,815 B2 | 10/2006 | Vaartstra |
| 6,812,157 B1 | 11/2004 | Gadgil | | 7,129,553 B2 | 10/2006 | Ahn et al. |
| 6,818,067 B2 | 11/2004 | Doering et al. | | 7,135,369 B2 | 11/2006 | Ahn et al. |
| 6,828,045 B1 | 12/2004 | Tokailin et al. | | 7,135,421 B2 | 11/2006 | Ahn et al. |
| 6,833,285 B1 | 12/2004 | Ahn et al. | | 7,135,734 B2 | 11/2006 | Eldridge et al. |
| 6,833,308 B2 | 12/2004 | Ahn et al. | | 7,138,336 B2 | 11/2006 | Lee et al. |
| 6,835,111 B2 | 12/2004 | Ahn et al. | | 7,141,278 B2 | 11/2006 | Koh et al. |
| 6,838,404 B2 | 1/2005 | Hentges et al. | | 7,153,744 B2 | 12/2006 | Chen et al. |
| 6,844,203 B2 | 1/2005 | Ahn et al. | | 7,160,817 B2 | 1/2007 | Marsh |
| 6,844,604 B2 | 1/2005 | Lee et al. | | 7,163,863 B2 | 1/2007 | Shone |
| 6,846,574 B2 | 1/2005 | Subramanian | | 7,166,886 B2 | 1/2007 | Forbes |
| 6,849,948 B2 | 2/2005 | Chen et al. | | 7,169,673 B2 | 1/2007 | Ahn et al. |
| 6,852,167 B2 | 2/2005 | Ahn | | 7,183,186 B2 * | 2/2007 | Ahn et al. .................. 438/591 |
| 6,858,120 B2 | 2/2005 | Ahn et al. | | 7,187,587 B2 | 3/2007 | Forbes |
| 6,858,444 B2 | 2/2005 | Ahn et al. | | 7,192,824 B2 | 3/2007 | Ahn et al. |
| 6,858,865 B2 | 2/2005 | Ahn et al. | | 7,196,007 B2 | 3/2007 | Vaartstra |
| 6,863,725 B2 | 3/2005 | Vaartstra et al. | | 7,199,023 B2 | 4/2007 | Ahn et al. |
| 6,884,739 B2 | 4/2005 | Ahn et al. | | 7,205,218 B2 | 4/2007 | Ahn et al. |
| 6,887,758 B2 | 5/2005 | Chindalore et al. | | 7,221,017 B2 | 5/2007 | Forbes et al. |
| 6,893,984 B2 | 5/2005 | Ahn et al. | | 7,221,586 B2 | 5/2007 | Forbes et al. |
| 6,900,122 B2 | 5/2005 | Ahn et al. | | 7,235,854 B2 | 6/2007 | Ahn et al. |
| 6,900,481 B2 | 5/2005 | Jin et al. | | 7,250,367 B2 | 7/2007 | Vaartstra et al. |
| 6,903,367 B2 | 6/2005 | Forbes | | 7,253,122 B2 | 8/2007 | Vaartstra |
| 6,914,800 B2 | 7/2005 | Ahn et al. | | 7,271,077 B2 | 9/2007 | Marsh et al. |
| 6,919,266 B2 | 7/2005 | Ahn et al. | | 7,274,067 B2 | 9/2007 | Forbes |
| 6,921,702 B2 | 7/2005 | Ahn et al. | | 7,279,413 B2 | 10/2007 | Park et al. |
| 6,929,830 B2 | 8/2005 | Tei et al. | | 7,294,556 B2 | 11/2007 | Vaartstra |
| 6,930,346 B2 | 8/2005 | Ahn et al. | | 7,297,617 B2 | 11/2007 | Farrar et al. |
| 6,933,225 B2 | 8/2005 | Werkhoven et al. | | 7,300,870 B2 | 11/2007 | Vaartstra |
| 6,949,433 B1 | 9/2005 | Hidehiko et al. | | 7,309,664 B1 | 12/2007 | Marzolin et al. |
| 6,952,032 B2 | 10/2005 | Forbes et al. | | 7,312,494 B2 | 12/2007 | Ahn et al. |
| 6,953,730 B2 | 10/2005 | Ahn et al. | | 7,326,980 B2 | 2/2008 | Ahn et al. |
| 6,955,968 B2 | 10/2005 | Forbes et al. | | 7,332,442 B2 | 2/2008 | Vaartstra et al. |
| 6,958,300 B2 | 10/2005 | Vaartstra et al. | | 7,374,617 B2 | 3/2008 | Vaartstra |
| 6,958,302 B2 | 10/2005 | Ahn et al. | | 7,368,402 B2 | 5/2008 | Vaartstra |
| 6,958,937 B2 | 10/2005 | Forbes et al. | | 7,410,918 B2 | 8/2008 | Vaartstra |
| 6,960,538 B2 | 11/2005 | Ahn et al. | | 7,476,925 B2 | 1/2009 | Eldridge, Jerome, et al. |
| 6,963,103 B2 | 11/2005 | Forbes | | 2001/0002280 A1 | 5/2001 | Sneh |
| 6,967,159 B2 | 11/2005 | Vaartstra | | 2001/0005625 A1 | 6/2001 | Sun et al. |
| 6,970,053 B2 | 11/2005 | Akram et al. | | 2001/0012698 A1 | 8/2001 | Hayashi et al. |
| 6,979,855 B2 | 12/2005 | Ahn et al. | | 2001/0014526 A1 | 8/2001 | Clevenger et al. |
| 6,982,230 B2 | 1/2006 | Cabral, Jr. et al. | | 2001/0017369 A1 | 8/2001 | Iwasaki et al. |
| 6,984,591 B1 | 1/2006 | Buchanan et al. | | 2001/0019876 A1 | 9/2001 | Juengling et al. |

| | | | | | |
|---|---|---|---|---|---|
| 2001/0034117 A1 | 10/2001 | Eldridge et al. | 2003/0207032 A1 | 11/2003 | Ahn et al. |
| 2001/0040430 A1 | 11/2001 | Ito et al. | 2003/0207540 A1 | 11/2003 | Ahn et al. |
| 2001/0042505 A1 | 11/2001 | Vaartstra | 2003/0207564 A1 | 11/2003 | Ahn et al. |
| 2001/0050438 A1 | 12/2001 | Juengling et al. | 2003/0207593 A1 | 11/2003 | Derderian et al. |
| 2002/0001971 A1 | 1/2002 | Cho | 2003/0213987 A1 | 11/2003 | Basceri |
| 2002/0002216 A1 | 1/2002 | Tooley | 2003/0216038 A1 | 11/2003 | Madhukar et al. |
| 2002/0004276 A1 | 1/2002 | Ahn et al. | 2003/0227033 A1 | 12/2003 | Ahn et al. |
| 2002/0004277 A1 | 1/2002 | Ahn et al. | 2003/0228747 A1 | 12/2003 | Ahn et al. |
| 2002/0013052 A1 | 1/2002 | Visokay | 2003/0232511 A1 | 12/2003 | Metzner et al. |
| 2002/0019116 A1 | 2/2002 | Sandhu et al. | 2003/0235961 A1 | 12/2003 | Metzner et al. |
| 2002/0019125 A1 | 2/2002 | Juengling et al. | 2004/0004244 A1 | 1/2004 | Ahn et al. |
| 2002/0028541 A1 | 3/2002 | Lee et al. | 2004/0004247 A1 | 1/2004 | Forbes |
| 2002/0037603 A1 | 3/2002 | Eldridge et al. | 2004/0016944 A1 | 1/2004 | Ahn et al. |
| 2002/0051859 A1 | 5/2002 | Iida et al. | 2004/0023461 A1 | 2/2004 | Ahn et al. |
| 2002/0053869 A1 | 5/2002 | Ahn et al. | 2004/0023516 A1 | 2/2004 | Londergan et al. |
| 2002/0058578 A1 | 5/2002 | Shindo | 2004/0033681 A1 | 2/2004 | Ahn et al. |
| 2002/0076070 A1 | 6/2002 | Yoshikawa et al. | 2004/0033701 A1 | 2/2004 | Ahn et al. |
| 2002/0086555 A1 | 7/2002 | Ahn et al. | 2004/0038554 A1 | 2/2004 | Ahn |
| 2002/0090806 A1 | 7/2002 | Ahn et al. | 2004/0040494 A1 | 3/2004 | Vaartstra et al. |
| 2002/0111001 A1 | 8/2002 | Ahn | 2004/0040501 A1 | 3/2004 | Vaartstra |
| 2002/0113261 A1 | 8/2002 | Iwasaki et al. | 2004/0043151 A1 | 3/2004 | Vaartstra |
| 2002/0117704 A1 | 8/2002 | Gonzalez | 2004/0043541 A1 | 3/2004 | Ahn et al. |
| 2002/0117963 A1 | 8/2002 | Chuman et al. | 2004/0043569 A1 | 3/2004 | Ahn et al. |
| 2002/0122885 A1 | 9/2002 | Ahn | 2004/0043600 A1 | 3/2004 | Vaartstra |
| 2002/0125490 A1 | 9/2002 | Chuman et al. | 2004/0043604 A1 | 3/2004 | Vaartstra |
| 2002/0130338 A1 | 9/2002 | Ahn et al. | 2004/0043625 A1 | 3/2004 | Vaartstra et al. |
| 2002/0132374 A1 | 9/2002 | Basceri et al. | 2004/0043630 A1 | 3/2004 | Vaartstra et al. |
| 2002/0135048 A1 | 9/2002 | Ahn et al. | 2004/0043632 A1 | 3/2004 | Vaartstra |
| 2002/0145845 A1 | 10/2002 | Hunt et al. | 2004/0043633 A1 | 3/2004 | Vaartstra |
| 2002/0155688 A1 | 10/2002 | Ahn | 2004/0043634 A1 | 3/2004 | Vaartstra |
| 2002/0155689 A1 | 10/2002 | Ahn | 2004/0043635 A1 | 3/2004 | Vaartstra |
| 2002/0167057 A1 | 11/2002 | Ahn et al. | 2004/0043636 A1 | 3/2004 | Vaartstra et al. |
| 2002/0167089 A1 | 11/2002 | Ahn et al. | 2004/0066484 A1 | 4/2004 | Tokailin et al. |
| 2002/0170671 A1 | 11/2002 | Matsuhita et al. | 2004/0086897 A1 | 5/2004 | Mirkin et al. |
| 2002/0172799 A1 | 11/2002 | Subramanian | 2004/0092073 A1 | 5/2004 | Cabral, Jr. et al. |
| 2002/0176989 A1 | 11/2002 | Knudsen et al. | 2004/0094801 A1 | 5/2004 | Liang et al. |
| 2002/0177244 A1 | 11/2002 | Hsu et al. | 2004/0097022 A1 | 5/2004 | Werkhoven et al. |
| 2002/0192974 A1 | 12/2002 | Ahn et al. | 2004/0110348 A1 | 6/2004 | Ahn et al. |
| 2002/0192975 A1 | 12/2002 | Ahn | 2004/0110391 A1 | 6/2004 | Ahn et al. |
| 2002/0192979 A1 | 12/2002 | Ahn | 2004/0126954 A1 | 7/2004 | Marsh et al. |
| 2002/0197793 A1 | 12/2002 | Dornfest et al. | 2004/0144980 A1 | 7/2004 | Ahn et al. |
| 2002/0197881 A1 | 12/2002 | Ramdani et al. | 2004/0152254 A1 | 8/2004 | Vaartstra et al. |
| 2003/0001190 A1 | 1/2003 | Basceri et al. | 2004/0164357 A1 | 8/2004 | Ahn et al. |
| 2003/0003635 A1 | 1/2003 | Paranjpe et al. | 2004/0164365 A1 | 8/2004 | Ahn et al. |
| 2003/0003702 A1 | 1/2003 | Ahn | 2004/0169453 A1 | 9/2004 | Ahn et al. |
| 2003/0003722 A1 | 1/2003 | Vaartstra | 2004/0171280 A1 * | 9/2004 | Conley et al. ............ 438/785 |
| 2003/0008243 A1 | 1/2003 | Ahn et al. | 2004/0175882 A1 | 9/2004 | Ahn et al. |
| 2003/0017717 A1 | 1/2003 | Ahn | 2004/0178439 A1 | 9/2004 | Ahn et al. |
| 2003/0020169 A1 | 1/2003 | Ahn et al. | 2004/0183108 A1 | 9/2004 | Ahn |
| 2003/0020180 A1 | 1/2003 | Ahn et al. | 2004/0185654 A1 | 9/2004 | Ahn |
| 2003/0026697 A1 | 2/2003 | Subramanian et al. | 2004/0187968 A1 | 9/2004 | Vaartstra |
| 2003/0040196 A1 | 2/2003 | Lim et al. | 2004/0189175 A1 | 9/2004 | Ahn et al. |
| 2003/0045060 A1 | 3/2003 | Ahn et al. | 2004/0196620 A1 | 10/2004 | Knudsen et al. |
| 2003/0045078 A1 | 3/2003 | Ahn et al. | 2004/0197946 A1 | 10/2004 | Vaartstra et al. |
| 2003/0048745 A1 | 3/2003 | Yoshikawa et al. | 2004/0198069 A1 | 10/2004 | Metzner et al. |
| 2003/0049900 A1 | 3/2003 | Forbes et al. | 2004/0214399 A1 | 10/2004 | Ahn et al. |
| 2003/0064607 A1 | 4/2003 | Leu et al. | 2004/0219746 A1 | 11/2004 | Vaartstra et al. |
| 2003/0067046 A1 | 4/2003 | Iwasaki et al. | 2004/0219783 A1 | 11/2004 | Ahn et al. |
| 2003/0106490 A1 | 6/2003 | Jallepally et al. | 2004/0222476 A1 | 11/2004 | Ahn et al. |
| 2003/0119246 A1 | 6/2003 | Ahn | 2004/0233010 A1 | 11/2004 | Akram et al. |
| 2003/0119291 A1 | 6/2003 | Ahn et al. | 2004/0248398 A1 | 12/2004 | Ahn et al. |
| 2003/0130127 A1 | 7/2003 | Hentges et al. | 2004/0251815 A1 | 12/2004 | Tokailin et al. |
| 2003/0132491 A1 | 7/2003 | Ahn | 2004/0251841 A1 | 12/2004 | Negishi et al. |
| 2003/0139039 A1 | 7/2003 | Ahn et al. | 2004/0262700 A1 | 12/2004 | Ahn et al. |
| 2003/0141560 A1 | 7/2003 | Sun | 2004/0266117 A1 | 12/2004 | Hwang |
| 2003/0142569 A1 | 7/2003 | Forbes | 2004/0266217 A1 | 12/2004 | Kim et al. |
| 2003/0143801 A1 | 7/2003 | Basceri et al. | 2005/0009266 A1 | 1/2005 | Vaartstra |
| 2003/0157764 A1 | 8/2003 | Ahn et al. | 2005/0009335 A1 | 1/2005 | Dean et al. |
| 2003/0162399 A1 | 8/2003 | Singh et al. | 2005/0009368 A1 | 1/2005 | Vaartstra |
| 2003/0172872 A1 | 9/2003 | Thakur et al. | 2005/0009370 A1 | 1/2005 | Ahn |
| 2003/0176049 A1 | 9/2003 | Hegde et al. | 2005/0019978 A1 | 1/2005 | Vaartstra et al. |
| 2003/0176065 A1 | 9/2003 | Vaartstra | 2005/0020017 A1 | 1/2005 | Ahn et al. |
| 2003/0200917 A1 | 10/2003 | Vaartstra | 2005/0023574 A1 | 2/2005 | Forbes et al. |

| | | |
|---|---|---|
| 2005/0023584 A1 | 2/2005 | Derderian et al. |
| 2005/0023594 A1 | 2/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |
| 2005/0026374 A1 | 2/2005 | Ahn et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032360 A1 | 2/2005 | Vaartstra |
| 2005/0034662 A1 | 2/2005 | Ahn |
| 2005/0037563 A1 | 2/2005 | Ahn |
| 2005/0040034 A1 | 2/2005 | Landgraf et al. |
| 2005/0051828 A1 | 3/2005 | Park et al. |
| 2005/0054165 A1 | 3/2005 | Ahn et al. |
| 2005/0070126 A1 | 3/2005 | Senzaki |
| 2005/0077519 A1 | 4/2005 | Ahn et al. |
| 2005/0085152 A1 | 4/2005 | Tokailin et al. |
| 2005/0124109 A1 | 6/2005 | Quevado-Lopez et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0136689 A9 | 6/2005 | Vaartstra |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0151184 A1 | 7/2005 | Lee et al. |
| 2005/0157549 A1 | 7/2005 | Mokhlesi et al. |
| 2005/0158973 A1 | 7/2005 | Ahn et al. |
| 2005/0160981 A9 | 7/2005 | Vaartstra et al. |
| 2005/0164521 A1 | 7/2005 | Ahn et al. |
| 2005/0169054 A1 | 8/2005 | Forbes |
| 2005/0173755 A1 | 8/2005 | Forbes |
| 2005/0221006 A1 | 10/2005 | Vaartstra |
| 2005/0221623 A1 | 10/2005 | Passlack et al. |
| 2005/0227442 A1 | 10/2005 | Ahn et al. |
| 2005/0274978 A1 | 12/2005 | Antoniadis et al. |
| 2005/0277256 A1 | 12/2005 | Ahn et al. |
| 2005/0280067 A1 | 12/2005 | Ahn et al. |
| 2005/0287804 A1 | 12/2005 | Vaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0008966 A1 | 1/2006 | Forbes et al. |
| 2006/0024975 A1 | 2/2006 | Ahn et al. |
| 2006/0035405 A1* | 2/2006 | Park et al. ................... 438/104 |
| 2006/0043492 A1 | 3/2006 | Ahn et al. |
| 2006/0043504 A1 | 3/2006 | Ahn et al. |
| 2006/0046383 A1 | 3/2006 | Chen et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0054943 A1 | 3/2006 | Li et al. |
| 2006/0105523 A1 | 5/2006 | Afzali-Ardakani et al. |
| 2006/0118853 A1 | 6/2006 | Takata et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0172485 A1 | 8/2006 | Vaartstra |
| 2006/0177975 A1 | 8/2006 | Ahn et al. |
| 2006/0194438 A1 | 8/2006 | Rao et al. |
| 2006/0228868 A1 | 10/2006 | Ahn et al. |
| 2006/0231017 A1 | 10/2006 | Vaartstra |
| 2006/0231889 A1 | 10/2006 | Chen et al. |
| 2006/0237764 A1 | 10/2006 | Ahn et al. |
| 2006/0244100 A1 | 11/2006 | Ahn et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258097 A1 | 11/2006 | Forbes et al. |
| 2006/0258175 A1 | 11/2006 | Vaartstra et al. |
| 2006/0261376 A1 | 11/2006 | Forbes et al. |
| 2006/0261389 A1 | 11/2006 | Vaartstra |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0264066 A1* | 11/2006 | Bartholomew et al. ....... 438/785 |
| 2006/0274580 A1 | 12/2006 | Forbes |
| 2006/0292788 A1 | 12/2006 | Vaartstra |
| 2007/0004224 A1 | 1/2007 | Currie |
| 2007/0006798 A1 | 1/2007 | Vaartstra et al. |
| 2007/0037415 A1 | 2/2007 | Ahn et al. |
| 2007/0045752 A1* | 3/2007 | Forbes et al. ................. 257/387 |
| 2007/0059881 A1 | 3/2007 | Ahn et al. |
| 2007/0087563 A1 | 4/2007 | Ahn et al. |
| 2007/0090441 A1 | 4/2007 | Ahn et al. |
| 2007/0099366 A1 | 5/2007 | Ahn et al. |
| 2007/0101929 A1 | 5/2007 | Ahn et al. |
| 2007/0105313 A1 | 5/2007 | Forbes |
| 2007/0111544 A1 | 5/2007 | Ahn |
| 2007/0138565 A1 | 6/2007 | Datta et al. |
| 2007/0144438 A1 | 6/2007 | Vaartstra |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0178643 A1 | 8/2007 | Forbes et al. |
| 2007/0181931 A1 | 8/2007 | Ahn et al. |
| 2007/0187772 A1 | 8/2007 | Ahn et al. |
| 2007/0295273 A1 | 12/2007 | Vaartstra |
| 2008/0014689 A1* | 1/2008 | Cleavelin et al. ............. 438/197 |
| 2008/0064210 A1 | 3/2008 | Vaartstra |
| 2008/0102629 A1 | 5/2008 | Vaartstra |
| 2008/0193791 A1 | 8/2008 | Ahn et al. |
| 2009/0032910 A1 | 2/2009 | Ahn et al. |

OTHER PUBLICATIONS

Aarik, Jaan , "Influence of substrate temperature on atomic layer growth and properties of $HfO_2$ thin films", *Thin Solid Films*, 340(1-2), (1999), 110-116.

Aarik, Jaan , "Phase transformations in hafnium dioxide thin films grown by atomic layer deposition at high temperatures", *Applied Surface Science*, 173(1-2), (Mar. 2001),15-21.

Aarik, Jaan , "Texture development in nanocrystalline hafnium dioxide thin films grown by atomic layer deposition", *Journal of Crystal Growth*, 220(1-2), (Nov. 15, 2000),105-113.

Ahn, Kie Y., "ALD of Amorphous Lanthanide Doped $TiO_x$ Films", U.S. Appl. No. 11/092,072, filed Mar. 29, 2005.

Ahn, "Atomic Layer Deposited Dielectric Layers", U.S. Appl. No. 10/379,470, filed Mar. 4, 2003.

Ahn, Kie Y., "Atomic Layer Deposited Hafnium Tantalum Oxide Dielectrics", U.S. Appl. No. 11/029,757, filed Jan. 5, 2005.

Ahn, Kie Y., "Atomic Layer Deposited Lanthanum Aluminum Oxide Dielectric Layer", U.S. Appl. No. 10/930,167, filed Aug. 31, 2004.

Ahn, Kie Y., "Atomic Layer Deposited Lanthanum Hafnium Oxide Dielectrics", U.S. Appl. No. 11/010,529, filed Dec. 13, 2004.

Ahn, Kie Y., "Atomic Layer Deposited Titanium Aluminum Oxide Films", U.S. Appl. No. 10/931,533, filed Aug. 31, 2004.

Ahn, Kie Y., "Atomic Layer Deposited Titanium Silicon Oxide Films", U.S. Appl. No. 11/093,104, filed Mar. 29, 2005.

Ahn, Kie Y., "Atomic Layer Deposited Zirconium Silicon Oxide Films", U.S. Appl. No. 11/117,121, filed Apr. 28, 2005.

Ahn, Kie Y., "Atomic Layer Deposition of a Ruthenium Layer to a Lanthanide Oxide Dielectric Layer", U.S. Appl. No. 11/117,125, filed Apr. 28, 2005.

Ahn, Kie Y., "Atomic Layer Deposition of $CEO_2/AL_2O_3$ Films as Gate Dielectrics", U.S. Appl. No. 11/055,380, filed Feb. 10, 2005.

Ahn, Kie Y., "Atomic Layer Deposition of Dγ-Doped HFO$_2$ Films as Gate Dielectrics", U.S. Appl. No. 11/053,577, filed Feb. 8, 2005.

Ahn, Kie Y., "Atomic Layer Deposition of Hf$_3$N$_4$/HfO$_2$ Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., "Atomic Layer Deposition of Zr$_3$N$_4$/ZrO$_2$ Films as Gate Dielectrics", U.S. Appl. No. 11/058,563, filed Feb. 15, 2005.

Ahn, Kie Y., "Cobalt Titanium Oxide Dielectric Films", U.S. Appl. No. 11/216,958, filed Aug. 31, 2005.

Ahn, Kie Y., "Gallium Lanthanide Oxide Films (working title)", (U.S. Appl. No. 11/329,025, filed Jan. 10, 2006.

Ahn, "Iridium / Zirconium Oxide Structure", U.S. Appl. No. 11/152,759, filed Jun. 14, 2005.

Ahn, Kie Y., "Lanthanide Yttrium Aluminum Oxide Dielectric Films", U.S. Appl. No. 11/297,567, filed Dec. 8. 2005.

Ahn, Kie Y., "Lanthanum Aluminum Oxynitride Dielectric Films", U.S. Appl. No. 11/216,474, filed Aug. 31, 2005.

Ahn, Kie Y., "Magnesium Titanium Oxide Films", U.S. Appl. No. 11/189,075, filed Jul. 25, 2005.

Ahn, Kie Y., "Ruthenium Gate for a Lanthanide Oxide Dielectric Layer", U.S. Appl. No. 10/926,812, filed Aug. 26, 2004.

Ahn, Kie Y., "Zirconium-Doped Gadolinium Oxide Films", U.S. Appl. No. 11/215,578, filed Aug. 29, 2005.

Chen, F., "A study of mixtures of HFO$_2$ and TiO$_2$ as high-k gate dielectrics", *Microelectronic Engineering 72*, (2004),263.

Chen, F., et al., "Hafnium Titanate as a High-K Gate Insulator", *Electrochemical Society Proceedings*, vol. 2004-01, (2004),278-285.

Conley Jr., J F., et al., "Atomic Layer Deposition of Hafnium Oxide Using Anhydrous Hafnium Nitrate", *Electrochemical and Solid State Letters*, 5(5), (2002),C57-C59.

Domagala, R. F., et al., "The Pseudobinary Ti-ZrO$_2$", *J. Am. Ceramic Soc.*, vol. 56, Paper first presented in 1970,(1973),584-587.

Gealy, et al., "Graded Dielectric Layers", U.S. Appl. No. 11/216,542, filed Aug. 30, 2005.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1-7.8.6.

Kukli, Kaupo, "Comparison of hafnium oxide films grown by atomic layer deposition from iodide and chloride precursors", *Thin Solid Films*, 416, (2002),72-79.

Leskela, M, "ALD precursor chemistry: Evolution and future challenges", *Journal de Physique IV (Proceedings)*, 9(8), (Sep. 1999),837-852.

Nalwa, H. S., "Handbook of Thin Film Materials", *Deposition and Processing of thin Films*, vol. 1, San Diego : Academic Press,(2002),114-119.

Robertson, John, "Band offsets of wide-band-gap oxides and implications for future electronic devices", *Journal of Vacuum Science & Technology B: Microelectronics and Nanometer Structures*, 18(3), (May 2000),1785-1791.

Ruh, Robert, et al., "Phase Relations and Thermal Expansion in the System HfO$_2$- TiO$_2$", *J. Am. Ceramic Soc.*, 59, (Nov.-Dec. 1976),495-499.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000), 105-114.

Sneh, Ofer, "Thin film atomic layer deposition equipment for semiconductor processing", *Thin Solid Films*, 402(1-2), (2002),248-261.

Suntola, T., "Atomic Layer Epitaxy", *Handbook of Crystal Growth, 3; Thin Films of Epitaxy, Part B: Growth Mechanics and Dynamics*, Amsterdam (1994),601-663.

Wilk, G. D., "High-K gate dielectrics: Current status and materials properties considerations", *Journal of Applied Physics*, 89(10), (May 2001),5243-5275.

Fang, Q., et al., "Investigation of TiO$_2$-doped HfO$_2$ thin films deposited by photo-CVD", *Thin Solid Films 428*, (2003),263-268.

Forbes, "Hafnium Tantalum Oxynitride High-K Dielectric and Metal Gates", U.S. Appl. No. 11/515,114, filed Aug. 31, 2005.

Forbes, et al., "Tantalum Aluminum Oxynitride High-K Dielectric and Metal Gates", U.S. Appl. No. 11/514,655, filed Aug. 31, 2006.

Ritala, M., "Atomic layer deposition of oxide thin films with metal alkoxides as oxygen sources", *Science*, 288(5464), (Apr. 14, 2000),319-321.

Ritala, Mikko, "Atomic Layer Epitaxy Growth of Titanium, Zirconium and Hafnium Dioxide Thin Films", *Annales Academiae Scientiarum Fennicae*, (1994),24-25.

* cited by examiner

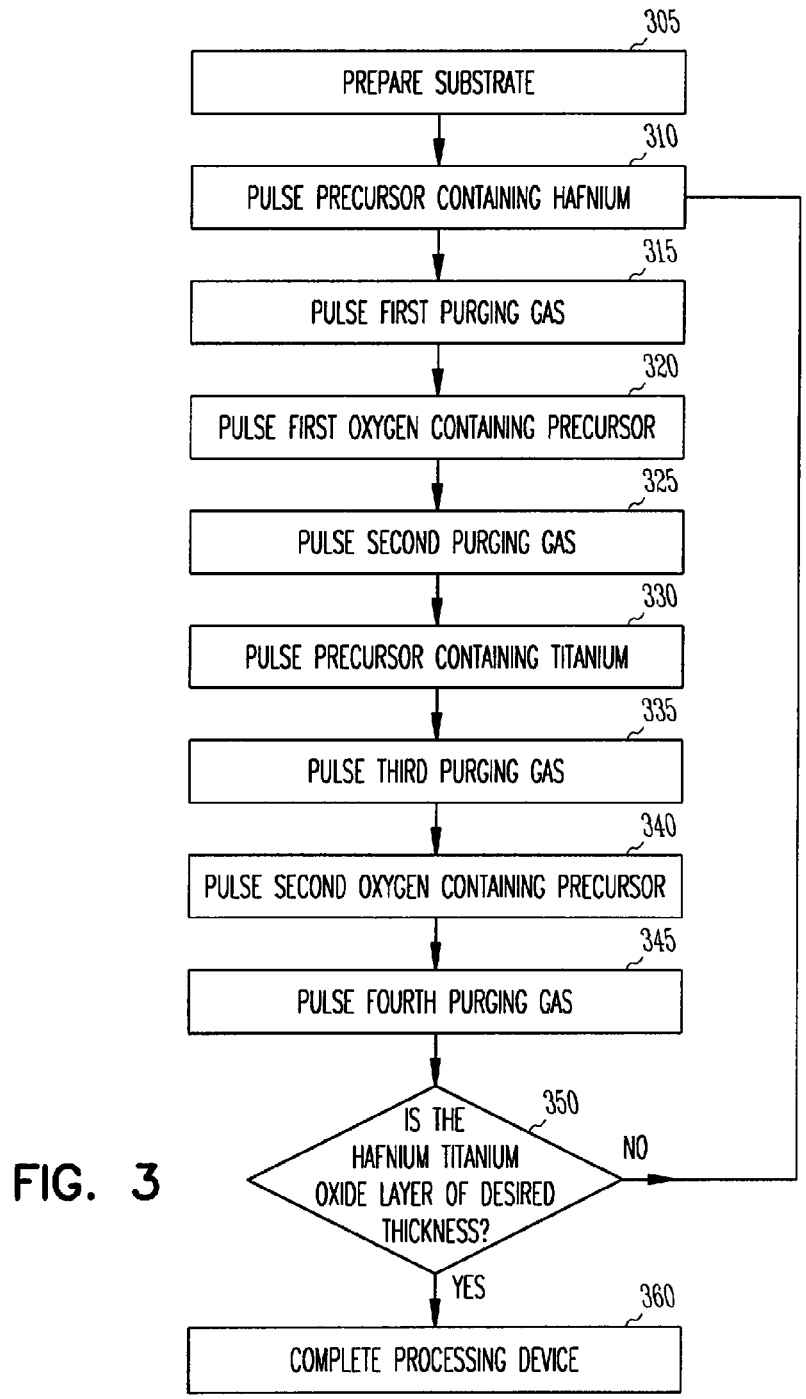

ness of a theoretical $SiO_2$ layer that would be required to have

HAFNIUM TITANIUM OXIDE FILMS

This application is a divisional of U.S. application Ser. No. 11/140,643 filed May 27, 2005, which is incorporated herein by reference in its entirety.

TECHNICAL FIELD

This application relates generally to semiconductor devices and device fabrication.

BACKGROUND

The semiconductor device industry has a market driven need to reduce the size of devices such as transistors. To reduce transistor size, the thickness of a silicon dioxide, $SiO_2$, gate dielectric is typically reduced in proportion to the shrinkage of the gate length. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based metal oxide semiconductor field effect transistor (MOSFET) or variations thereof. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as dielectrics in these microelectronic devices.

BRIEF DESCRIPTION OF THE DRAWINGS

FIG. 2 illustrates a flow diagram of elements for an embodiment of a method to form a dielectric layer containing a hafnium titanium oxide film.

FIG. 3 illustrates a flow diagram of elements for an embodiment of a method to form a dielectric layer containing a hafnium titanium oxide film.

DETAILED DESCRIPTION

Figure 1:
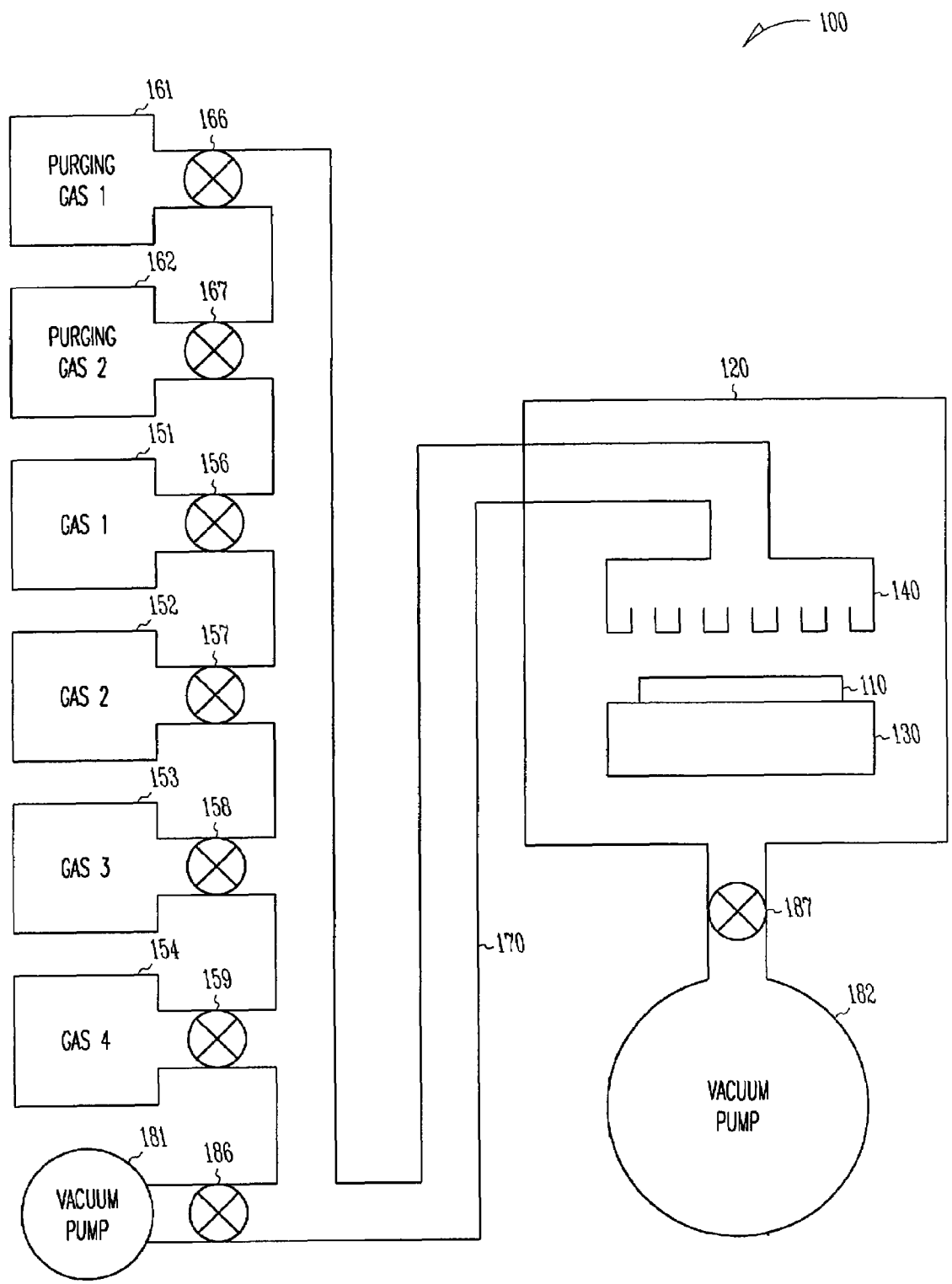
FIG. 1 depicts all atomic layer deposition system for an embodiment of a method for fabricating a dielectric layer containing a hafnium titanium oxide film.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the teen insulator or dielectric is defined generally to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness for a $SiO_2$ layer used for) a gate dielectric would need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer, though this additional thickness may be eliminated by using a metal gate electrode. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a SiO$_2$—Si based structure. This electrical isolation is due to the relatively large band gap of SiO$_2$ (8.9 eV), making it a good insulator from electrical conduction. Significant reductions in its band gap would eliminate it as a material for a gate dielectric. As the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as in a larger or bulk layer. As a result of incomplete formation relative to a bulk structure, a thin SiO$_2$ layer of only one or two monolayers will not form a full band gap. The lack of a full band gap in a SiO$_2$ gate dielectric would cause an effective short between an underlying Si channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a $t_{eq}$ less than about 10 Å, dielectrics other than SiO$_2$ should be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with SiO$_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of SiO$_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower transistor operating voltages and smaller transistor dimensions may be realized by a significant number of materials, but additional fabricating requirements make determining a suitable replacement for SiO$_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of SiO$_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the SiO$_2$ thickness and a multiplicative factor of the thickness, t, of the dielectric being formed, written as $$t_{eq}=t_{SiO_2}+(\kappa_{ox}/\kappa)t.$$

Thus, if a SiO$_2$ layer is formed in the process, the $t_{eq}$ is again limited by a SiO$_2$ layer. In the event that a barrier layer is formed between the silicon layer and the desired dielectric in which the barrier layer prevents the formation of a SiO$_2$ layer, the $t_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer should provide a high quality interface to maintain a high channel carrier mobility.

One of the advantages of using SiO$_2$ as a gate dielectric has been that the formation of the SiO$_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to SiO$_2$ also have the disadvantage of a crystalline form, at least in a bulk configuration. The best candidates for replacing SiO$_2$ as a gate dielectric are those that can be fabricated as a thin layer with an amorphous form and that have high dielectric constants.

High-κ materials include materials having a dielectric constant greater than silicon dioxide, for example, dielectric materials having a dielectric constant greater than about twice the dielectric constant of silicon dioxide. Examples of such high-κ materials include HfO$_2$, ZrO$_2$, Ta$_2$O$_5$, TiO$_2$, La$_2$O$_3$, Al$_2$O$_3$, Y$_2$O$_3$, metal silicates, and metal aluminates. Other characteristics for choosing a silicon oxide replacement include using materials that provide a sharp interface with silicon, which may provide a low density of interface states, a large energy barrier from the conduction band to the Fermi level of the gate electrode to maintain leakage current at acceptable levels, and structural stability with contact electrodes and substrate material during device processing steps performed after providing the dielectric layer. The high-κ material HfO$_2$ also has a relatively large band offset and is stable with respect to formation on silicon. In an embodiment, TiO$_2$ may be combined with HfO$_2$ to provide a dielectric material with a dielectric constant larger than that of HfO$_2$, which is about 25, since the dielectric constant of TiO$_2$ is about 80.

In various embodiments, electronic devices include a dielectric layer containing a hafnium titanium oxide film, where the hafnium titanium oxide film is structured as one or more monolayers. Furthermore, the hafnium titanium oxide film may be a specific stoichiometric hafnium titanium oxide. The hafnium titanium oxide film may be a non-stoichiometric hafnium titanium oxide. The hafnium titanium oxide film may be a combination of stoichiometric hafnium titanium oxide and non-stoichiometric hafnium titanium oxide. The expression Hf$_x$Ti$_{1-x}$O$_2$ or its equivalent forms may be used to include a stoichiometric hafnium titanium oxide. The expression Hf$_x$Ti$_{1-x}$O$_2$ or its equivalent forms may be used to include a non-stoichiometric hafnium titanium oxide. The expression Hf$_x$Ti$_{1-x}$O$_2$ or its equivalent forms may be used to include a combination of a stoichiometric hafnium titanium oxide and a non-stoichiometric hafnium titanium oxide. In an embodiment, a hafnium titanium oxide film includes HfTiO$_4$. The expression HfO$_x$ may be used to include a stoichiometric hafnium oxide. The expression HfO$_x$ may be used to include a non-stoichiometric hafnium oxide. The expression HfO$_x$ may be used to include a combination of a stoichiometric hafnium oxide and a non-stoichiometric hafnium oxide. The expression TiO$_y$ may be used to include a stoichiometric hafnium oxide. The expression TiO$_y$ may be used to include a non-stoichiometric hafnium oxide. The expression TiO$_y$ may be used to include a combination of a stoichiometric hafnium oxide and a non-stoichiometric hafnium oxide. In various embodiments, various oxide layers may be doped with other elements.

In an embodiment, a film of hafnium titanium oxide, structured as one or more monolayers, may have a thickness that ranges from a monolayer to thousands of angstroms. The film may be processed by atomic layer deposition (ALD). The dielectric layer may be substantially the hafnium titanium oxide film. Alternatively, the dielectric layer may include multiple layers with at least one layer being a film of hafnium titanium oxide. Dielectric layers of hafnium titanium oxide offer a material that can provide a relatively high dielectric constant with respect to that of silicon oxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current. Engineering a hafnium titanium oxide film can provide dielectric layers for electronic devices with dielectric constants that may range in value from about 25 for $HfO_2$ to about 80 for $TiO_2$. Lower dielectric constants may be associated with ultra-thin films due to size effects.

Another consideration for selecting the material and method for forming a dielectric layer for use in electronic devices and systems concerns the roughness of a dielectric layer on a substrate. Surface roughness of the dielectric layer has a significant effect on the electrical properties of a gate oxide and the resulting operating characteristics of its associated transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a hafnium titanium oxide dielectric layer having a substantially smooth surface relative to other processing techniques is formed using atomic layer deposition. Further, forming such a dielectric layer using atomic layer deposition may control transitions between material layers. Thus, atomic layer deposited hafnium titanium oxide dielectric layers can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly larger, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming hafnium oxide from a $HfI_4$ precursor and $H_2O_2$, as its reactant precursor, forms an embodiment of a hafnium/oxygen sequence, which can also be referred to as a hafnium sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, $H_2O_2$ is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that deposits $ABO_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of hafnium titanium oxide is formed on a substrate mounted in a reaction chamber using ALD in repetitive hafnium and titanium sequences using precursor gases individually pulsed into the reaction chamber. Alternatively, solid or liquid precursors can be used in an appropriately designed reaction chamber.

FIG. 1 shows an atomic layer deposition system 100 for an embodiment for processing a dielectric layer containing a hafnium titanium oxide film. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154 whose flow is controlled by mass-flow controllers 156-159, respectively. Gas sources 151-154 may provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases, fewer purging gas sources are required for ALD system 100. Gas sources 151-154 and purging gas sources 161-162 may be coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases from the gas conduit at the end of a purging sequence.

Vacuum pump, or exhaust pump, 182 is coupled by mass-flow controller 187 to remove excess precursor gases, purging gases, and by-product gases from reaction chamber 120 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for practicing embodiments of the present invention, other commercially available ALD systems can be used.

The use, construction and fundamental operation of reaction chambers for deposition of films are understood by those of ordinary skill in the art of semiconductor fabrication. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading and studying this disclosure.

The elements of ALD system 100 can be controlled by a computer. To focus on the use of ALD system 100 in the various embodiments, the computer is not shown. Those skilled in the art can appreciate that the individual elements such as pressure control, temperature control, and gas flow within ALD system 100 can be under computer control.

In an embodiment, a method for forming an electronic apparatus includes forming a dielectric layer containing a hafnium titanium oxide film in an integrated circuit, where the $Hf_xTi_{1-x}O_2$ film may be structured as one or more monolayers. The thickness of the $Hf_xTi_{1-x}O_2$ film may range from a monolayer to thousands of angstroms depending on the application. The hafnium titanium oxide film may be formed by atomic layer deposition. In an embodiment, the dielectric layer may be formed substantially as the hafnium titanium oxide film. In an embodiment, the hafnium titanium oxide film may be engineered with a predetermined amount of hafnium with respect to the total amount of hafnium and titanium in the $Hf_xTi_{1-x}O_2$ film, taking into account the band offset and dielectric constant of the constructed film. In various non-limiting embodiments, the dielectric layer may be formed as a dielectric in a capacitor in an integrated circuit, as a dielectric in a capacitor of a dynamic random access memory, as a gate insulator in a silicon complementary metal oxide semiconductor (CMOS) transistor, as a tunnel gate insulator in a flash memory device, as an inter-gate insulator in a flash memory device, as a dielectric region in a non-volatile read only memory (NROM) flash memory, and as a nanolaminate dielectric in a NROM flash memory. Embodiments of a dielectric layer containing a hafnium titanium oxide film may be an integral part of a wide variety of electronic devices in electronic apparatus and systems, according to the teachings herein.

In an embodiment, a method includes forming a dielectric layer containing a hafnium titanium oxide film including forming the hafnium titanium oxide film by atomic layer deposition. FIG. 2 illustrates a flow diagram of elements for an embodiment of a method to form a dielectric layer containing a hafnium titanium oxide film. At 210, a hafnium precursor is pulsed to a substrate. The pulsing may provide a material layer having uniform coverage of the desired area of the substrate surface for forming the dielectric layer. Alternatively, coverage of a specific device area may be attained with partial coverage during a particular processing of a sequence. A number of precursors containing hafnium may be used for providing hafnium to the substrate. In an embodiment, a hafnium precursor may include one of more of a hafnium halide or a hafnium nitride. Other hafnium containing precursors may be used.

At 220, a titanium precursor is pulsed to the substrate. The pulsing may provide a material layer having uniform coverage of the desired area of the substrate surface for forming the dielectric layer. Alternatively, coverage of a specific device area may be attained with partial coverage during a particular processing of a sequence. A number of precursors containing titanium may be used for providing titanium to the substrate. In an embodiment, a titanium precursor may include one or more of a titanium halide, a titanium nitrate, $Ti(OCH(CH_3)_2)_4$, or $Ti(OC_2H_5)_4$. Other titanium containing precursors may be used. In an embodiment, the hafnium precursor is pulsed before the titanium precursor is pulsed. In an embodiment, the titanium precursor is pulsed before the hafnium precursor is pulsed. Alternatively, hafnium and titanium may be jointly provided to a substrate using precursors that substantially do not react with each other, but provide chemisorption or reaction at the substrate surface and allow subsequent reaction with an oxidant precursor.

In various embodiments, an oxygen reactant precursor is pulsed after pulsing a purging gas following each pulsing of the titanium precursors and the hafnium precursors. Various oxidant reactant precursors may be used, including, but not limited to, one or more of water, atomic oxygen, molecular oxygen, ozone, hydrogen peroxide, a water—hydrogen peroxide mixture, alcohol, or nitrous oxide. Alternatively, titanium precursors that contain oxygen may be used such that the titanium sequence does not use an oxygen reactant precursor. Hafnium precursors that contain oxygen may be used such that the hafnium sequence does not use an oxygen reactant precursor. Titanium precursors that contain oxygen and hafnium precursors that contain oxygen may be used such that the titanium sequence and the hafnium sequence do not use an oxygen reactant precursor.

Films of $Hf_xTi_{1-x}O_2$ may be processed over a wide range of temperatures. Low temperature processing may lead to an amorphous structure and have less adverse effects on the substrate and any devices formed prior to the ALD formation of the hafnium titanium film. In an embodiment, a film of $Hf_xTi_{1-x}O_2$ is formed on a substrate with the substrate maintained at a temperature of about 600° C. or less. The hafnium titanium oxide film may be formed as an integral component of an electronic device in an integrated circuit.

A hafnium titanium oxide film may be formed using a number of cycles having various permutations of hafnium/oxide sequences and titanium/oxide sequences. In an embodiment, the hafnium sequences and the titanium sequences are controlled to form the hafnium titanium oxide film with a predetermined amount of titanium with respect to the total amount of titanium and hafnium in the hafnium titanium oxide film. By controlling the content of the titanium and the hafnium in the hafnium titanium oxide film, a film may be engineered with predetermined electrical characteristics. With a high titanium content relative to hafnium, the dielectric constant of the film approaches that of titanium oxide. With a low titanium content relative to hafnium, the dielectric constant of the film approaches that of hafnium oxide. In an embodiment, a $Hf_xTi_{1-x}O_2$ film has a hafnium to titanium ratio ranging from about 0.5 to about 2.5. The titanium content may be adjusted to provide a hafnium titanium oxide film having a dielectric constant in the 25-80 range.

In the various embodiments, the thickness of a hafnium titanium oxide film is related to the number of ALD cycles performed and the growth rate associated with the selected permutations of sequences in the cycles. As can be understood by those skilled in the art, particular effective growth rates for the engineered hafnium titanium oxide film can be determined during normal initial testing of the ALD system for processing a hafnium titanium oxide dielectric for a given application without undue experimentation.

Either before or after forming the hafnium titanium film, other dielectric layers such as nitride layers, insulating metal oxide layers, or combinations of nitride and insulating metal oxide layers may be formed as part of the dielectric layer or dielectric stack. Depending on the application, a dielectric stack containing a hafnium titanium oxide film may include a silicon oxide layer. The dielectric layer may be formed as a nanolaminate. An embodiment of a nanolaminate may include a layer of hafnium oxide and a hafnium titanium oxide film, a layer of titanium oxide and a hafnium titanium oxide film, layers of hafnium oxide and titanium oxide along with a hafnium titanium oxide film, or various other combinations. Alternatively, the dielectric layer may be formed substantially as the hafnium titanium oxide film.

In various embodiments, the structure of the interface between the dielectric layer and the substrate on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

Atomic layer deposition of the individual components of the hafnium titanium oxide film allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a $Hf_xTi_{l-x}O_2$ film, each precursor can be pulsed into the reaction under separate environmental conditions. The substrate can be maintained at a selected temperature and the reaction chamber maintained at a selected pressure independently for pulsing each precursor. Appropriate temperatures and pressures may be maintained, whether the precursor is a single precursor or a mixture of precursors. During atomic layer deposition, the pulsing of the precursor gases is separated by purging the reaction chamber with a purging gas following each pulsing of a precursor. In an embodiment, nitrogen gas may be used as the purging gas following the pulsing of each precursor used in a cycle to form a film of hafnium titanium oxide. Additionally, excess gases and byproducts may be removed from the reaction chamber by pulsing purging gases. Excess gases and byproducts may be removed from the reaction chamber by evacuating the reaction chamber. Excess gases and byproducts may be removed from the reaction chamber by pulsing purging gases and evacuating the reaction chamber.

FIG. 3 illustrates a flow diagram of elements for an embodiment of a method to form a dielectric layer containing an atomic layer deposited hafnium titanium oxide film. This embodiment may be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire, sapphire substrates, or other suitable substrates may be used. This preparation process may include cleaning substrate 110 and forming layers and regions of the substrate, such as drains and sources of a metal oxide semiconductor (MOS) transistor, prior to forming a gate dielectric. Alternatively, these active regions may be formed after forming the dielectric layer, depending on the overall fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a hafnium titanium oxide dielectric formed using the atomic layer deposition process. The material composition and properties of an interface layer are typically dependent on process conditions and the condition of the substrate before forming the dielectric layer. Though the existence of an interface layer may effectively reduce the dielectric constant associated with the dielectric layer and its substrate, the interface layer, such as a $SiO_2$ interface layer or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the alt. Prior to forming a gate dielectric, masking of substrate regions to be protected during the gate dielectric formation, as is typically performed in MOS fabrication, may be included in the processing. In this embodiment, the unmasked region includes a body region of a transistor; however, one skilled in the alit will recognize that other semiconductor device structures may utilize this process. Other sequencing may be used. Additionally, the substrate 110 in its ready-for-processing form is positioned in reaction chamber 120 for ALD processing.

At 310, a precursor containing hafnium is pulsed into reaction chamber 120. The hafnium precursor may be pulsed into reaction chamber 120 through the gas-distribution fixture 140 onto substrate 110. The flow of the hafnium precursor may be controlled by mass-flow controller 156 from gas source 151, where the hafnium precursor is maintained. In an embodiment, a hafnium precursor pulsed may be $HfCl_4$. In an embodiment using a $HfCl_4$ precursor, the substrate temperature may be maintained at a temperature ranging from about 180° C. to about 600° C. by heating element 130. In an embodiment using a $HfCl_4$ precursor, the substrate temperature may be maintained at a temperature ranging from about 300° C. to about 940° C. In an embodiment, a hafnium precursor pulsed may be $HfI_4$. In an embodiment using a $HfI_4$ precursor, the substrate temperature may be maintained at a temperature of about 300° C. In an embodiment, a hafnium precursor pulsed may be anhydrous $Hf(NO_3)_4$. In an embodiment using a $Hf(NO_3)_4$ precursor on a hydrogen-terminated silicon, the substrate temperature may be maintained at a temperature ranging from about 160° C. to about 180° C. However, use of the individual hafnium precursors is not limited to the temperature ranges of these embodiments. The hafnium precursor reacts with the surface of the substrate 110 in the desired region defined by the unmasked areas of the substrate 110.

At 315, a first purging gas is pulsed into the reaction chamber 120. In an embodiment, an inert gas is used as a purging gas and a carrier gas. The inert gas flow is controlled by mass-flow controller 166 from the purging gas source 161 into the gas conduit 170. Using the inert gas purge avoids overlap of the precursor pulses and possible gas phase reactions. In an embodiment, nitrogen, argon gas, or other inert gases may be used as the purging gas. Following the purge, a first oxygen-containing precursor is pulsed into the reaction chamber 120, at 320.

Water vapor may be used as a precursor acting as an oxygen reactant. The $H_2O$ vapor is pulsed into the reaction chamber 120 through gas conduit 170 from gas source 152 by mass-flow controller 157. The water vapor reacts aggressively at the surface of substrate 110. Other oxygen reactant precursors may be used.

Following the pulsing of the first oxygen-containing precursor, a second purging gas is injected into the reaction chamber 120, at 325. An inert gas may be used to purge the reaction chamber after pulsing each precursor gas in the hafnium/oxygen sequence. In an embodiment, nitrogen, argon gas or other inert gases may be used as the purging gas. Excess precursor gas and reaction by-products may be removed from the system by the purge gas, in conjunction with the exhausting of the reaction chamber 120 using vacuum pump 182 through mass-flow controller 187 and the exhausting of the gas conduit 170 by the vacuum pump 181 through mass-flow controller 186. In an embodiment, the hafnium sequence may be performed a number of times before proceeding to pulse a precursor containing titanium into reaction chamber 120.

At 330, a precursor containing titanium is pulsed into reaction chamber 120. The titanium precursor may be pulsed to the surface of the substrate 110 through gas-distribution fixture 140 from gas source 153 by mass-flow controller 158. In an embodiment, a titanium precursor pulsed may be $TiCl_4$. In an embodiment using a $TiCl_4$ precursor, the substrate temperature may be maintained at a temperature ranging from about 100° C. to about 500° C. by heating element 130. In an embodiment using a TiCl$_4$ precursor, the substrate temperature may be maintained at a temperature of about 425° C. In an embodiment, a titanium precursor pulsed may be TiI$_4$. In an embodiment using a TiI$_4$ precursor, the substrate temperature may be maintained between about 230° C. and about 490° C. In an embodiment, a titanium precursor pulsed may be anhydrous Ti(NO$_3$)$_4$. In an embodiment using a Ti(NO$_3$)$_4$ precursor, the substrate temperature may be maintained at a temperature ranging from less than 250° C. to about 700° C. In an embodiment, a titanium precursor pulsed may be titanium isopropoxide, also written as Ti(O$^i$—Pr)$_4$. In an embodiment using a Ti(O$^i$—Pr)$_4$ precursor, the substrate temperature may be maintained at a temperature ranging from less than 250° C. to about 700° C. However, use of the individual titanium precursors is not limited to the temperature ranges of these embodiments. The titanium precursor reacts with the surface of the substrate 110 in the desired region defined by the unmasked areas of the substrate 110.

At 335, a third purging gas is introduced into the system. In an embodiment following a titanium precursor, an inert gas may be used as a purging and carrier gas. In various embodiments, nitrogen, argon, or other inert gases may be used as a purging gas. The flow of the third purging gas is controlled by mass-flow controller 167 from the purging gas source 162 into the gas conduit 170 and subsequently into the reaction chamber 120.

At 340, a second oxygen-containing precursor is pulsed into the reaction chamber 120. For a titanium sequence, water vapor may be used as the precursor acting as an oxidizing reactant to interact at the substrate 110. The H$_2$O vapor is pulsed into the reaction chamber 120 through gas conduit 170 from gas source 152 by mass-flow controller 157. The water vapor reacts aggressively at the surface of substrate 110. Other oxygen reactant precursors may be used.

At 345, a fourth purging gas is injected into the reaction chamber 120. In an embodiment, an inert gas is used as the fourth purging gas to purge the reaction chamber. In various embodiments, nitrogen, argon, or other inert gases may be used as the fourth purging gas. Excess precursor gas and reaction by-products may be removed from the system by the purge gas, in conjunction with the exhausting of the reaction chamber 120 using vacuum pump 182 through mass-flow controller 187 and the exhausting of the gas conduit 170 by the vacuum pump 181 through mass-flow controller 186.

In an embodiment, the precursors used for the ALD formation of a Hf$_x$Ti$_{1-x}$O$_2$ film may be selected to provide a carbon-free process. In an embodiment, the precursors used for the ALD formation of a Hf$_x$Ti$_{1-x}$O$_2$ film may be selected to provide a chlorine-free process. In an embodiment, the precursors used for the ALD formation of a Hf$_x$Ti$_{1-x}$O$_2$ film may be selected to provide a carbon-free and a chlorine-free process. Using carbon-free precursors may limit performance reducing effects associated with carbon residue. Using chlorine-free precursors may limit performance reducing effects associated with chlorine residue. Using carbon-free and chlorine-free precursors may limit performance reducing effects associated with carbon and chlorine residue. The precursors used in the ALD processing of a Hf$_x$Ti$_{1-x}$O$_2$ film may be selected such that the titanium precursor and the hafnium precursor are similar such as using a HfR precursor when a TiR precursor is used, where R represents one or more elements. For example, in an embodiment, a HfCl$_4$ precursor and a TiCl$_4$ precursor may be used in an ALD process to form Hf$_x$Ti$_{1-x}$O$_2$. Other similar embodiments may be used with other halides, nitrates, and other compounds individually containing hafnium and titanium. Such pairing may provide for a limited number or types of residues, if any occur.

At 350, it is determined whether the hafnium titanium oxide film is of the desired thickness, t. The thickness of a hafnium titanium oxide film after one cycle is determined by the pulsing periods used in the hafnium sequences and the titanium sequences at the given temperatures. Once a set of periods for one cycle is determined, the growth rate for the hafnium titanium oxide film may be set at a value such as N nm/cycle. For a desired hafnium titanium oxide film thickness in an application such as forming a gate dielectric of a MOS transistor, the ALD process should be repeated for t/N cycles.

The desired thickness should be completed after t/N cycles. If less than t/N cycles have been completed, the process starts over at 310 with the pulsing of the precursor containing hafnium. If t/N cycles have completed, no further ALD processing is required and the hafnium titanium oxide film is completed. Once the total number of cycles to form the desired thickness has been completed, the dielectric film containing the hafnium titanium oxide film may optionally be annealed. In an embodiment, the hafnium titanium oxide film may be annealed in a nitrogen atmosphere.

At 360, after forming the hafnium titanium oxide film, processing the device having the dielectric layer containing hafnium titanium oxide film is completed. In an embodiment, completing the device includes further processing of the dielectric layer to include layers of other dielectric materials. In an embodiment, completing the device includes completing the formation of a transistor. In another embodiment, completing the device includes completing the formation of a capacitor. Alternatively, completing the process includes completing the construction of a memory device having an array with access transistors formed with gate dielectrics containing atomic layer deposited hafnium titanium oxide films. In an embodiment, completing the process includes the formation of an electronic system such as an information handling device that uses electronic devices formed with dielectric films containing an atomic layer deposited hafnium titanium oxide film.

Embodiments for methods having elements similar to the embodiment of FIG. 3 may include numerous permutations for forming the hafnium titanium oxide film. In an embodiment, the titanium sequence is conducted before the hafnium sequence. In an embodiment, a hafnium/titanium cycle may include a number, x, of hafnium sequences and a number, y, of titanium sequences. The number of sequences x, y may be selected to engineer the relative amounts of titanium to hafnium. In an embodiment, the number of sequences x and y, along with associated pulsing periods and times, is selected to form a hafnium titanium oxide with substantially equal amounts of hafnium and titanium. In an embodiment, the number of sequences is selected with x=y. In an embodiment, the number of sequences x and y are selected to form a hafnium-rich hafnium titanium oxide. Alternatively, the number of sequences x and y are selected to form a titanium-rich hafnium titanium oxide. In an embodiment of a method that includes forming a hafnium titanium oxide film, an atomic layer deposition sequence includes forming an atomic layer of hafnium oxide followed by forming an atomic layer of titanium oxide. In an embodiment of a method that includes forming a hafnium titanium oxide film, an atomic layer deposition sequence includes forming an atomic layer of titanium oxide followed by forming an atomic layer of hafnium oxide.

Various embodiments provide atomic layer deposited hafnium titanium oxide films that are amorphous and have smooth interfaces with other layers relative to a hafnium titanium oxide film formed by other methods such as chemical vapor deposition, sputtering, sol gel, pulsed-laser deposition and reactive magnetron radio frequency sputtering. Processing a hafnium titanium oxide film by atomic layer deposition allows for the fabrication of an amorphous dielectric layer, which may avoid increased leakage current through grain boundaries that typically may accompany formation of polycrystalline films. Various embodiments provide a process for growing a dielectric film having a wide range of useful equivalent oxide thickness, $t_{eq}$, associated with a dielectric constant in the range from about 10 to about 80, depending on interface layers and size effects. Forming dielectric layers containing $Hf_xTi_{1-x}O_2$ may allow the formation of layers with a $t_{eq}$ ranging from about 5 Å to about 20 Å. In an embodiment, a dielectric layer containing a hafnium titanium oxide film may have a $t_{eq}$ of less than 5 Å. Additionally, various embodiments may be implemented to form transistors, capacitors, memory devices, and other electronic systems including information handling devices.

Figure 4:
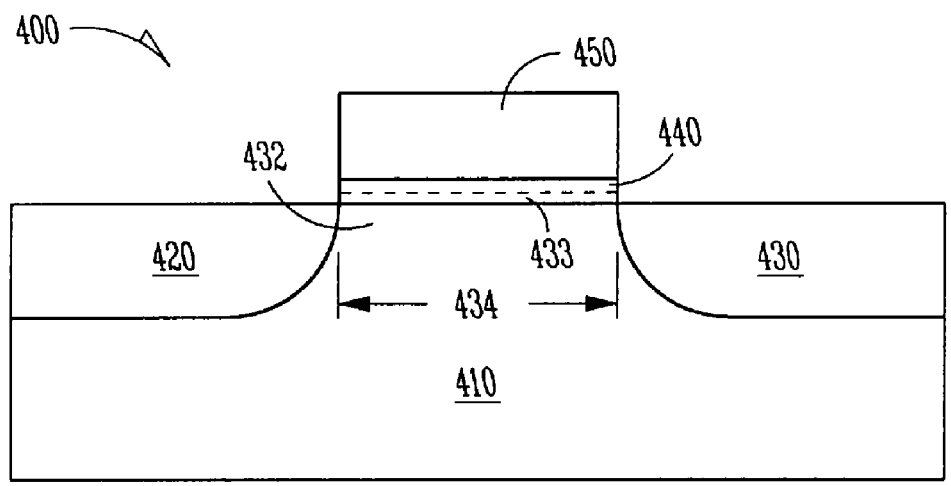
FIG. 4 shows an embodiment of a configuration of a transistor having a dielectric layer containing a hafnium titanium oxide film structured as one or more monolayers.

A transistor 400 as depicted in FIG. 4 may be constructed by forming a source region 420 and a drain region 430 in a silicon based substrate 410 where source and drain regions 420, 430 are separated by a body region 432. Body region 432 defines a channel having a channel length 434. A gate 450 is formed over and contacts gate dielectric 440 disposed on substrate 410. In an embodiment, gate dielectric 440 contains a hafnium titanium oxide film. Gate dielectric 440 may be realized as a dielectric layer formed substantially of a hafnium titanium oxide film. Gate dielectric 440 may be a dielectric layer containing one or more layers of dielectric material in which at least one layer is a hafnium titanium oxide film. The hafnium titanium oxide film may be a hafnium titanium oxide film structured as monolayers of hafnium titanium oxide.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. Forming the substrate, gate, and the source and drain regions may be performed using standard processes known to those skilled in the alt. Additionally, the sequencing of the various elements of the process for forming a transistor may be conducted with standard fabrication processes, as known to those skilled in the art. In an embodiment, gate dielectric 440 may be realized as a gate insulator in a silicon CMOS transistor. Use of such a gate dielectric including a hafnium titanium oxide is not limited to silicon based substrates, but may be used with a variety of semiconductor substrates.

Figure 5:
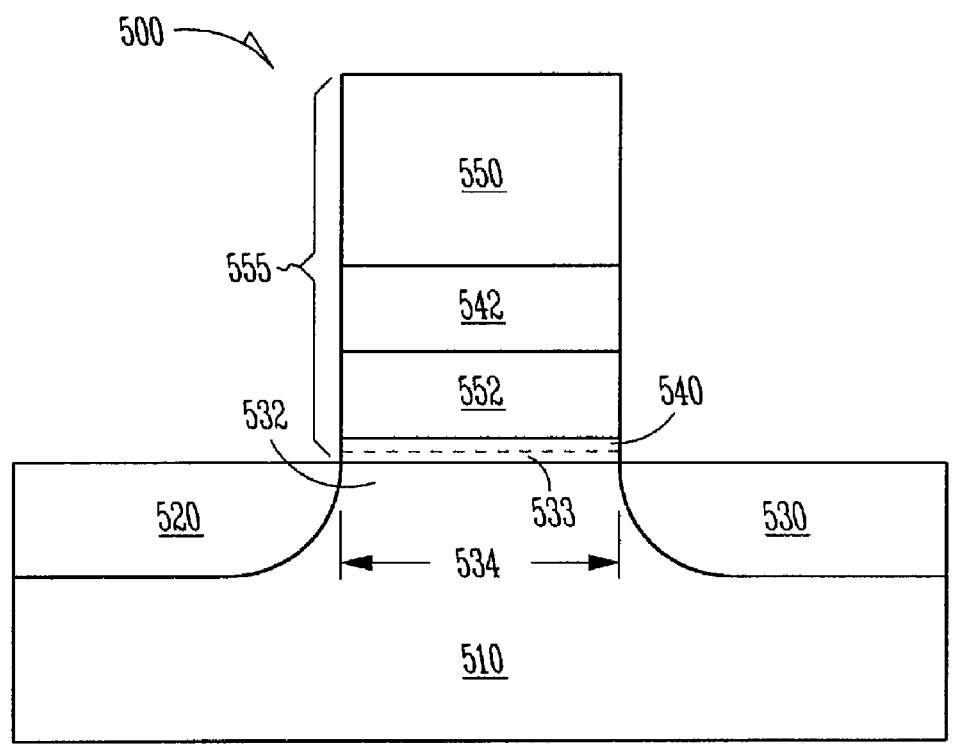
FIG. 5 shows an embodiment of a configuration of a floating gate transistor having a dielectric layer containing a hafnium titanium oxide film structured as one or more monolayers.

FIG. 5 shows an embodiment of a configuration of a floating gate transistor 500 having an insulating layer containing a hafnium titanium oxide film. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. In an embodiment, floating gate 552 is formed over and contacts gate dielectric 540. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated.

In an embodiment, gate dielectric 540 includes a dielectric containing a hafnium titanium oxide film structured as one or more monolayers. In an embodiment, gate dielectric 540 includes a dielectric containing an atomic layer deposited hafnium titanium oxide film. Gate dielectric 540 may be realized as a dielectric layer formed substantially of hafnium titanium oxide. Gate dielectric 540 may include multiple layers in which at least one layer is substantially hafnium titanium oxide. In an embodiment, gate dielectric 540 may include multiple layers where a substantially hafnium titanium oxide film contacts body region 532.

In an embodiment, floating gate dielectric 542 includes a dielectric layer having a hafnium titanium oxide film structured as one or more monolayers. Floating gate dielectric 542 may be realized as a dielectric layer formed substantially of hafnium titanium oxide. Floating gate dielectric 542 may include multiple layers in which at least one layer is substantially hafnium titanium oxide. In an embodiment, control gate 550 is formed over and contacts floating gate dielectric 542.

Alternatively, both gate dielectric 540 and floating gate dielectric 542 may be formed as dielectric layers including a hafnium titanium oxide film. In an embodiment, gate dielectric 540 and floating gate dielectric 542 may be realized by embodiments similar to those described herein, with the remaining elements of the transistor 500 formed using processes known to those skilled in the art.

In an embodiment, gate dielectric 540 forms a tunnel gate insulator and floating gate dielectric 542 forms an inter-gate insulator in flash memory devices. Gate dielectric 540 may include an insulating layer having a hafnium titanium oxide structured as one or more monolayers. Floating gate dielectric 542 may include an insulating layer having a hafnium titanium oxide structured as one or more monolayers. Gate dielectric 540 and floating gate dielectric 542 may include an insulating layer having a hafnium titanium oxide structured as one or more monolayers. Use of dielectric layers configured in various embodiments is not limited to silicon based substrates, but may be used with a variety of semiconductor substrates.

Figure 6:
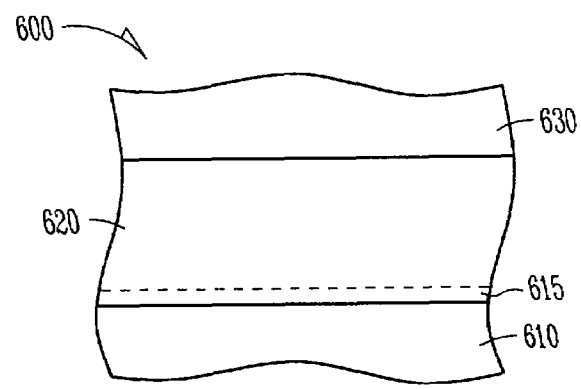
FIG. 6 shows an embodiment of a configuration of a capacitor having a dielectric layer containing a hafnium titanium oxide film structured as one or more monolayers.

Embodiments of methods for forming dielectric layers containing a hafnium titanium oxide film may also be applied to forming capacitors in various integrated circuits, memory devices, and electronic systems. In an embodiment for a capacitor 600 illustrated in FIG. 6, a method includes forming a first conductive layer 610, forming a dielectric layer 620 containing a hafnium titanium oxide film structured as one or more monolayers on first conductive layer 610, and forming a second conductive layer 630 on dielectric layer 620. Dielectric layer 620, including an insulating layer having a hafnium titanium oxide film, may be formed using various embodiments.

An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated.

Dielectric layer 620 may be realized as a dielectric layer formed substantially of hafnium titanium oxide. Dielectric layer 620 may include multiple layers in which at least one layer is substantially hafnium titanium oxide. In an embodiment, dielectric layer 620 may include multiple layers where a substantially hafnium titanium oxide film contacts first conductive layer 610. Embodiments for dielectric layer 620 in a capacitor include, but are not limited to, dielectrics in DRAM capacitors and dielectrics in capacitors in analog, radio frequency (RF), and mixed signal integrated circuits, where mixed signal integrated circuits operate with digital and analog signals.

Various embodiments for a dielectric layer containing a hafnium titanium oxide film structured as one or more monolayers may provide for enhanced device performance by providing devices with reduced leakage current. The hafnium titanium oxide film may include atomic layer deposited $Hf_x Ti_{1-x}O_2$. In an embodiment, such improvements in leakage current characteristics may be attained by forming one or more layers of an atomic layer deposited hafnium titanium oxide in a multi-layer dielectric stack such as a nanolaminate structure. In an embodiment, a nanolaminate includes a hafnium titanium oxide layer with other dielectric layers including other metal oxides such as hafnium oxide. In an embodiment, a nanolaminate includes a hafnium titanium oxide layer with other dielectric layers including other metal oxides such as titanium oxide. In an embodiment, a nanolaminate includes a hafnium titanium oxide layer with other dielectric layers including other metal oxides such as hafnium oxide and titanium oxide. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a $HfO_2/Hf_xTi_{1-x}O_2$ nanolaminate contains alternating layers of hafnium oxide and hafnium titanium oxide. In an embodiment, a $TiO_y/Hf_xTi_{1-x}O_2$ nanolaminate contains alternating layers of titanium oxide and hafnium titanium oxide. In an embodiment, a $HfO_z/TiO_y/Hf_xTi_{1-x}O_2$ nanolaminate contains various permutations of hafnium oxide layers, titanium oxide layers, and hafnium titanium oxide layers.

Figure 7:
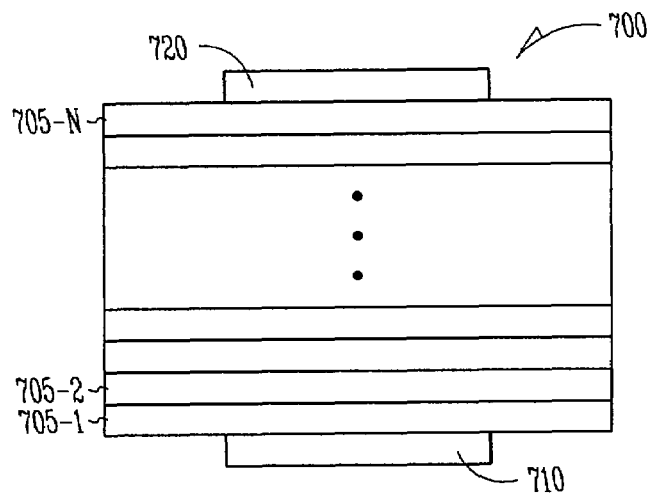
FIG. 7 depicts an embodiment of a dielectric layer including a nanolaminate having at least one layer containing a hafnium titanium oxide film structured as one or more monolayers.

FIG. 7 depicts a nanolaminate structure 700 for an embodiment of a dielectric structure including a hafnium titanium oxide film structured as one or more monolayers. The hafnium titanium oxide film may include atomic layer deposited $Hf_xTi_{1-x}O_2$. In an embodiment, nanolaminate structure 700 includes a plurality of layers 705-1, 705-2 to 705-N, where at least one layer contains a hafnium titanium oxide film formed according to various embodiments. The other layers may be other dielectric layers such as, but not limited to, dielectric metal oxides, insulating nitrides, and insulating oxynitrides. The sequencing of the layers depends on the application. In an embodiment, an atomic layer deposited hafnium titanium oxide film is the first layer formed on a substrate. In an embodiment, nanolaminate structure 700 contains an atomic layer deposited hafnium titanium oxide film in contact with conductive contact 710. In an embodiment, nanolaminate structure 700 contains an atomic layer deposited hafnium titanium oxide film in contact with conductive contact 720. In an embodiment, nanolaminate structure 700 contains one or more atomic layer deposited hafnium titanium oxide films in contact with conductive contact 710 and conductive contact 720. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant. Embodiments for structures such as nanolaminate structure 700 may be used as nanolaminate dielectrics in NROM flash memory devices as well as other integrated circuits. In an embodiment, a layer of the nanolaminate structure 700 is used to store charge in the NROM device. The charge storage layer of a nanolaminate structure 700 in an NROM device may be a silicon oxide layer.

Transistors, capacitors, and other devices having dielectric films containing an atomic layer deposited hafnium titanium oxide film formed according to various embodiments may be implemented into memory devices and electronic systems including information handling devices. Embodiments of these information handling devices may include wireless systems, telecommunication systems, and computers. Further, embodiments of electronic devices having dielectric films containing a hafnium titanium oxide film structured as one or more monolayers may be realized as integrated circuits.

Figure 8:
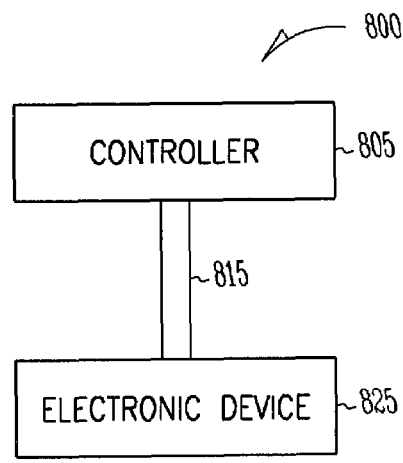
FIG. 8 is a simplified diagram for an embodiment of a controller coupled to an electronic device, where at least one of the controller or the electronic device has a dielectric layer containing a hafnium titanium oxide film structured as one or more monolayers.

FIG. 8 illustrates a diagram for an electronic system 800 having one or more devices having a dielectric layer containing a hafnium titanium oxide film structured as one or more monolayers. The hafnium titanium oxide film may be fabricated by atomic layer deposition according to various embodiments. In an embodiment, such a dielectric layer is formed substantially as a hafnium titanium oxide film. Electronic system 800 includes a controller 805, a bus 815, and an electronic device 825, where bus 815 provides conductivity between controller 805 and electronic device 825. In various embodiments, controller 805 may include an embodiment for a dielectric layer having a hafnium titanium oxide film structured as one or more monolayer-s. In various embodiments, electronic device 825 may include an embodiment for a dielectric layer having a hafnium titanium oxide film structured as one or more monolayers. In various embodiments, controller 805 and electronic device 825 may include an embodiment for a dielectric layer having a hafnium titanium oxide film structured as one or more monolayers. Electronic system 800 may include, but is not limited to, fiber optic systems, electro-optic systems, and information handling systems such as wireless systems, telecommunication systems, and computers.

Figure 9:
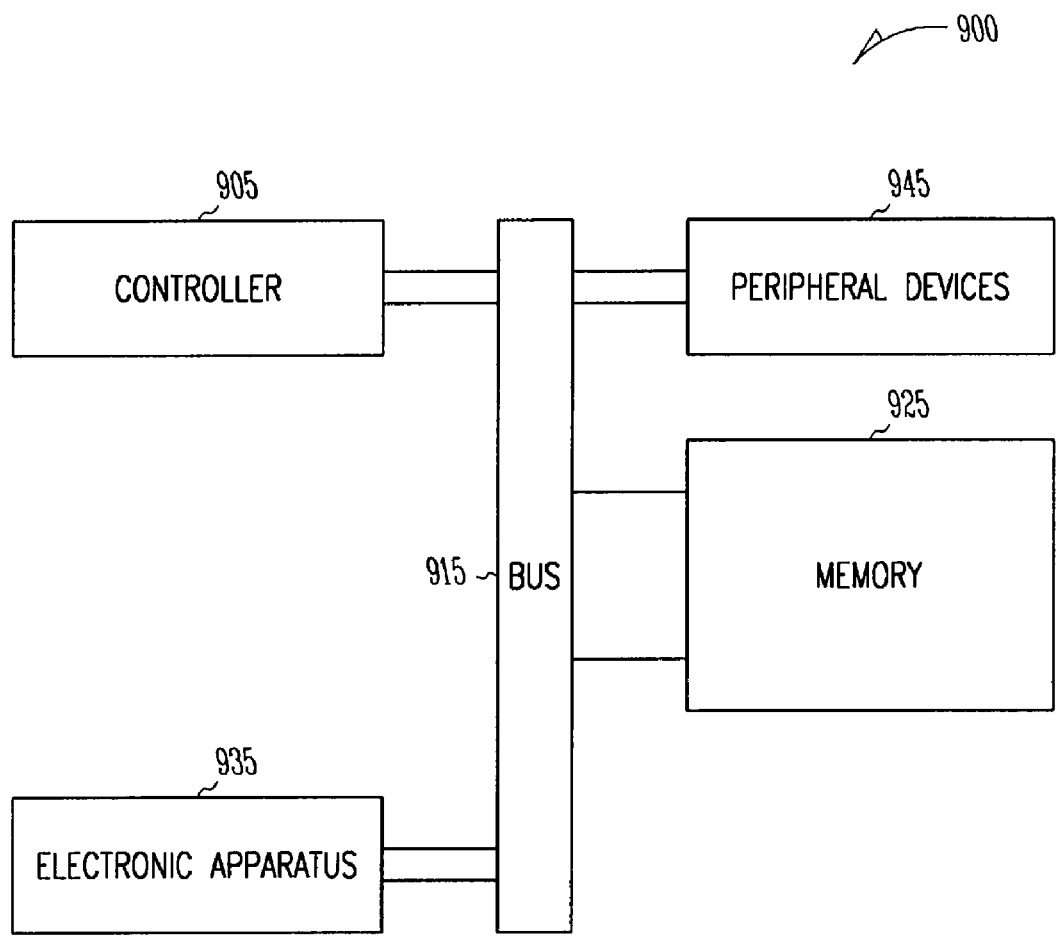
FIG. 9 illustrates a diagram for an embodiment of an electronic system having one or more devices with a dielectric layer containing a hafnium titanium oxide film structured as one or more monolayers.

FIG. 9 depicts a diagram of an embodiment of a system 900 having a controller 905 and a memory 925. Controller 905 may include a dielectric layer having a hafnium titanium oxide film structured as one or more monolayers. Memory 925 may include a dielectric layer having a hafnium titanium oxide film structured as one or more monolayers. Controller 905 and memory 925 may include a dielectric layer having a hafnium titanium oxide film structured as one or more monolayers. The hafnium titanium oxide film may be fabricated by atomic layer deposition according to various embodiments. In an embodiment, such a dielectric layer is formed substantially as a hafnium titanium oxide film. System 900 also includes an electronic apparatus 935 and a bus 915, where bus 915 provides conductivity between controller 905 and electronic apparatus 935, and between controller 905 and memory 925. Bus 915 may include an address, a data bus, and a control bus, each independently configured. Alternatively, bus 915 may use common conductive lines for providing address, data, control, or various combinations of address, data, and control, the use of which is regulated by controller 905. In an embodiment, electronic apparatus 935 may be additional memory configured in a manner similar to memory 925. An embodiment may include an additional peripheral device or devices 945 coupled to bus 915. In an embodiment, controller 905 is a processor. Any of controller 905, memory 925, bus 915, electronic apparatus 935, and peripheral device or devices 945 may include a dielectric layer including a hafnium titanium oxide film structured as one or more monolayers. System 900 may include, hut is not limited to, information handling devices such as wireless systems, telecommunication systems, and computers.

Peripheral devices 945 may include displays, additional storage memory, or other control devices that may operate in conjunction with controller 905. Alternatively, peripheral devices 945 may include displays, additional storage memory, or other control devices that may operate in conjunction with memory 925. Peripheral devices 945 may include displays, additional storage memory, or other control devices that may operate in conjunction with controller 905 and memory 925.

Memory 925 may be realized as a memory device containing a dielectric layer including a hafnium titanium oxide film structured as one or more monolayers. The hafnium titanium oxide film may be fabricated by atomic layer deposition according to various embodiments. In an embodiment, such a dielectric layer is formed substantially as a hafnium titanium oxide film. It will be understood that embodiments are equally applicable to any size and type of memory circuit and are not intended to be limited to a particular type of memory device. Memory types may include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An electronic device comprising:
an integrated circuit; and
a dielectric layer disposed in the integrated circuit, the dielectric layer including a nanolaminate, the nanolaminate having a hafnium titanium oxide ($Hf_xTi_yO_z$, x>0, y>0, z>0) layer and the nanolaminate having a hafnium oxide ($HfO_r$, r>0) layer, a titanium oxide ($TiO_s$, s>0) layer, or both a hafnium oxide ($HfO_r$, r>0) layer and a titanium oxide ($TiO_s$, s>0) layer, the hafnium titanium oxide disposed as a structured arrangement of one or more monolayers.

2. The electronic device of claim 1, wherein the hafnium titanium oxide layer includes atomic layer deposited hafnium titanium oxide.

3. The electronic device of claim 1, wherein the dielectric layer includes one or more of a dielectric metal oxide without titanium or hafnium, an insulating nitride, or an insulating oxynitride.

4. The electronic device of claim 1, wherein the electronic device includes a capacitor having the dielectric layer as a capacitor dielectric.

5. The electronic device of claim 1, wherein the electronic device includes a transistor in which the dielectric layer is disposed.

6. An electronic device comprising:
an integrated circuit; and
a dielectric stack disposed in the integrated circuit, the dielectric stack having at least three dielectric layers arranged as a nanolaminate having a layer of hafnium oxide ($HfO_r$, r>0) or titanium oxide ($TiO_s$, s>0) interspersed with a hafnium titanium oxide ($Hf_xTi_yO_z$, x>0, y>0, z>0) layer, the hafnium titanium oxide disposed as a structured arrangement of one or more monolayers.

7. The electronic device of claim 6, wherein the nanolaminate includes layers of hafnium oxide and titanium oxide interspersed with hafnium titanium oxide layers.

8. The electronic device of claim 6, wherein the dielectric stack is configured in a NROM device.

9. The electronic device of claim 8, wherein the nanolaminate includes a layer configured to store charge.

10. The electronic device of claim 9, wherein the layer configured to store charge includes a silicon oxide layer.

11. An electronic device comprising:
a memory; and
a dielectric layer disposed in an integrated circuit in the memory, the dielectric layer including a nanolaminate, the nanolaminate having a hafnium titanium oxide ($Hf_xTi_yO_z$, x>0, y>0, z>0) layer and the nanolaminate having a hafnium oxide ($HfO_r$, r>0) layer, a titanium oxide ($TiO_s$, s>0) layer, or both a hafnium oxide ($HfO_r$, r>0) layer and a titanium oxide ($TiO_s$, s>0) layer, the hafnium titanium oxide disposed as a structured arrangement of one or more monolayers, the hafnium titanium oxide layer being essentially carbon free.

12. The electronic device of claim 11, wherein the hafnium titanium oxide layer includes the hafnium titanium oxide layer essentially chlorine free.

13. The electronic device of claim 11, wherein the dielectric layer includes the dielectric layer disposed between and contacting two conductive layers.

14. The electronic device of claim 11, wherein the dielectric layer includes the dielectric layer disposed as a tunnel gate insulator in a transistor in the memory.

15. The electronic device of claim 11, wherein the dielectric layer includes the dielectric layer structured as the nanolaminate, the nanolaminate having a silicon oxide layer.

16. An electronic device comprising:
a memory; and
a dielectric layer disposed in an integrated circuit in the memory, the dielectric layer including a nanolaminate, the nanolaminate having a hafnium titanium oxide ($Hf_xTi_yO_z$, x>0, y>0, z>0) layer and the nanolaminate having a hafnium oxide ($HfO_r$, r>0) layer, a titanium oxide ($TiO_s$, s>0) layer, or both a hafnium oxide ($HfO_r$, r>0) layer and a titanium oxide ($TiO_s$, s>0) layer, the hafnium titanium oxide disposed as a structured arrangement of one or more monolayers, the hafnium titanium oxide layer being essentially chlorine free.

17. The electronic device of claim 16, wherein the dielectric layer is structured as the nanolaminate.

18. The electronic device of claim 16, wherein the dielectric layer includes the dielectric layer disposed between a floating gate and a control gate of a transistor.

19. The electronic device of claim 16, wherein the dielectric layer includes the dielectric layer structured as a nanolaminate having a titanium oxide layer without having a hafnium oxide layer.

20. The electronic device of claim 16, wherein the dielectric layer includes the dielectric layer structured as a nanolaminate having a hafnium oxide layer without having a titanium oxide layer.

21. A system comprising:
a controller;
a bus;
an electronic device coupled to the controller by the bus; and
a dielectric layer disposed in an integrated circuit in the controller or in the electronic device, the dielectric layer including a nanolaminate, the nanolaminate having a hafnium titanium oxide ($Hf_xTi_yO_z$, x>0, y>0, z>0) layer and the nanolaminate having a hafnium oxide ($HfO_r$, r>0) layer, a titanium oxide ($TiO_s$, s>0) layer, or both a hafnium oxide ($HfO_r$, r>0) layer and a titanium oxide (($TiO_s$, s>0) layer, the hafnium titanium oxide disposed as a structured arrangement of one or more monolayers.

22. The system of claim 21, wherein the hafnium titanium oxide layer includes a hafnium titanium oxide layer essentially chlorine free and essentially carbon free.

23. The system of claim 21, wherein the dielectric layer is structured as the nanolaminate.

24. The system of claim 21, wherein the controller includes a processor.

25. The system of claim 21, wherein the system includes an information handling system.

* * * * *

UNITED STATES PATENT AND TRADEMARK OFFICE
CERTIFICATE OF CORRECTION

PATENT NO. : 7,700,989 B2  Page 1 of 1
APPLICATION NO. : 11/565826
DATED : April 20, 2010
INVENTOR(S) : Kie Y. Ahn et al.

It is certified that error appears in the above-identified patent and that said Letters Patent is hereby corrected as shown below:

In column 21, line 4, in Claim 21, delete "($(TiO_S$," and insert -- ($TiO_S$, --, therefor.

Signed and Sealed this

Eighth Day of June, 2010

David J. Kappos
*Director of the United States Patent and Trademark Office*